(12) United States Patent
D'Antuono et al.

(10) Patent No.: US 11,875,093 B2
(45) Date of Patent: *Jan. 16, 2024

(54) COMPUTING TECHNIQUES FOR THREE-DIMENSIONAL MODELING AND DESIGN ANALYSIS

(71) Applicant: Boeing Ace Collateral Agent, LLC, Arlington, VA (US)

(72) Inventors: Raymond P. D'Antuono, El Cerrito, CA (US); Bharath Mukundakrishnan, San Jose, CA (US); Sushrut S. Pavanaskar, Castro Valley, CA (US); Dev G. Rajnarayan, Mountain View, CA (US)

(73) Assignee: Boeing Ace Collateral Agent, LLC, Arlington, VA (US)

( * ) Notice: Subject to any disclaimer, the term of this patent is extended or adjusted under 35 U.S.C. 154(b) by 109 days.

This patent is subject to a terminal disclaimer.

(21) Appl. No.: 17/668,222

(22) Filed: Feb. 9, 2022

(65) Prior Publication Data

US 2022/0300673 A1 Sep. 22, 2022

Related U.S. Application Data

(63) Continuation of application No. 16/023,162, filed on Jun. 29, 2018, now Pat. No. 11,386,245.
(Continued)

(51) Int. Cl.
*G06F 30/15* (2020.01)
*B64F 5/00* (2017.01)
(Continued)

(52) U.S. Cl.
CPC ............... *G06F 30/15* (2020.01); *B64F 5/00* (2013.01); *G06F 30/20* (2020.01); *G06F 30/28* (2020.01)

(58) Field of Classification Search
CPC .......... G06F 30/15; G06F 30/20; G06F 30/28; B64F 5/00
See application file for complete search history.

(56) References Cited

U.S. PATENT DOCUMENTS 10,719,645 B1 7/2020 Zhang et al.
2007/0296729 A1 12/2007 Du et al.
(Continued)

OTHER PUBLICATIONS

Asanovic et al., The Landscape of Parallel Computing Research: A View from Berkeley, Electrical Engineering and Computer Sciences, University of California at Berkeley, Dec. 18, 2006.
(Continued)

*Primary Examiner* — Steven W Crabb
(74) *Attorney, Agent, or Firm* — HANLEY, FLIGHT & ZIMMERMAN, LLC

(57) ABSTRACT

Techniques and systems for creating and performing analysis on three-dimensional computer models are described. The model creation and analysis may be specified using an un-compiled script that includes a set of instructions. The set of instructions may implement a computer-aided design (CAD) kernel using a bridge layer that includes compiled bridge code. The instructions may be used to create a job set having a group of tasks. Using the job set, a processing queue may be constructed, the processing queue having a subset of common tasks prioritized within the processing queue. Subsets or groups of tasks or instructions may also be executed in parallel using multiple distinct processors or a multi-threaded processor.

20 Claims, 16 Drawing Sheets

Related U.S. Application Data

(60) Provisional application No. 62/595,001, filed on Dec. 5, 2017, provisional application No. 62/527,627, filed on Jun. 30, 2017.

(51) Int. Cl.
*G06F 30/20* (2020.01)
*G06F 30/28* (2020.01)

(56) References Cited

U.S. PATENT DOCUMENTS

| | | |
|---|---|---|
| 2010/0030538 A1 | 2/2010 | Cazals |
| 2010/0223032 A1 | 9/2010 | Reghetti et al. |
| 2012/0069011 A1 | 3/2012 | Hurt et al. |
| 2014/0039847 A1 | 2/2014 | Georgescu et al. |
| 2015/0142152 A1 | 5/2015 | Rezayat |
| 2015/0317413 A1 | 11/2015 | Georgescu et al. |
| 2016/0055665 A1 | 2/2016 | Floyd et al. |
| 2017/0045417 A1 | 2/2017 | Rajnarayan et al. |
| 2017/0068750 A1* | 3/2017 | Glatfelter ............... G06V 20/64 |
| 2019/0005185 A1 | 1/2019 | D'Antuono et al. |

OTHER PUBLICATIONS

Olasz, "Geometric Kernels in COMSOL Multiphysics," Apr. 16, 2014, pp. 1-7, retrieved from www.comsol.com/blogs/geometric-kernels-comsol-multiphysics.com on Mar. 6, 2021.
International Search Report and Written Opinion, PCT/US2018/040236, filed Jun. 29, 2018, 13 pages.

* cited by examiner

COMPUTING TECHNIQUES FOR THREE-DIMENSIONAL MODELING AND DESIGN ANALYSIS

CROSS REFERENCE TO RELATED APPLICATIONS

This application is a continuation of U.S. patent application Ser. No. 16/023,162, filed Jun. 29, 2018, and titled "Computing Techniques for Three-Dimensional Modeling and Design Analysis, which is a non-provisional patent application of, and claims the benefit of, U.S. Provisional Patent Application No. 62/527,627, filed Jun. 30, 2017, and titled "Computing Techniques for Three-Dimensional Modeling and Design Analysis" and U.S. Provisional Patent Application No. 62/595,001, filed Dec. 5, 2017, and titled "Computing Techniques for Three-Dimensional Modeling and Design Analysis," the disclosure of each of which are hereby incorporated herein by reference in their entirety.

FIELD

The described embodiments relate generally to computer-aided design. More particularly, the present embodiments relate to techniques for improving the computing efficiency for computer-aided design (CAD), including script-based techniques for accessing a CAD kernel. The techniques may be used to create three-dimensional geometry or a model and perform analysis on the geometry or model using an optimized or parallel processing sequence.

BACKGROUND

Computer-aided design (CAD) has been used extensively in the design and manufacture of a large variety of products and systems. In general, computer models allow engineers and designers to create, visualize, and analyze designs to evaluate their viability before manufacturing begins. Depending on the complexity of the design and analysis, significant computer processing resources may be required to construct and evaluate the computer model. For very large or complex computer models, the processing capability of the computer hardware may become a limiting or significant factor in the speed of which multiple alternative designs may be constructed and evaluated.

The systems and techniques described herein are directed to computing techniques for constructing and evaluating computer models using a script-based or programmatic modeling scheme. As described herein, the script-based or programmatic modeling scheme may offer multiple advantages including a maximized or improved utilization of computing resources, which may enable rapid and efficient design evaluation.

SUMMARY

Some example embodiments are directed to a computer-implemented method for analyzing a three-dimensional computer model. The methods and systems described herein may be used to improve the processing speed or efficiency of a computer hardware system and, in some cases, may reduce the analysis time for performing computationally intensive and/or iterative design analyses.

In some example embodiments, a job set comprising a group of tasks is obtained and a subset of common tasks within the group of tasks is identified. Based on the job set, a processing queue is constructed, the processing queue having the subset of common tasks prioritized within the processing queue. A first group of tasks may be identified within the processing queue that can be executed independent of a second group of tasks within the processing queue. The first group of tasks may be executed on a first processing unit by implementing a first computer-aided design (CAD) kernel using a first bridge layer. The second group of tasks may be executed on a second processing unit that is distinct from the first processing unit by implementing a second computer-aided design (CAD) kernel using a second bridge layer.

In some example embodiments, the three-dimensional computer model is a solid model of an assembly of multiple components. The group of tasks of the job set may include constructing a solid model for each component of a set of components of the solid model assembly using a geometry-creation command implemented using either the first CAD kernel or the second CAD kernel using either the first bridge layer or the second bridge layer, respectively. The group of tasks of the job set may also include, for example: constructing a solid model for each of a set of components of the assembly; computing a mesh for each of the constructed solid models; and performing an analysis using the computed mesh for each of the constructed models. In some embodiments, the analysis is a clearance analysis that determines a minimum clearance between two or more components of the set of components of the assembly. In some embodiments, the analysis is an interference analysis that is configured to detect an interference condition between two or more components of the set of components of the assembly.

In some example embodiments, the assembly is a nominal assembly, and a delta assembly is defined as having at least one component that has a delta dimension that is incremented with respect to a nominal dimension of the nominal assembly. The analysis may include a spatial gradient computation that is configured to compute a spatial gradient between the nominal assembly and the delta assembly.

In some example embodiments, the three-dimensional computer model includes an assembly of multiple components. The first group of tasks of the processing queue may include a computation of a first mesh for a first set of components of the assembly, and the second group of tasks of the processing queue may include a computation of a second mesh for a second set of components of the assembly. In some implementations, the first set of components has a working envelope that does not overlap with the second set of components.

In some embodiments, the first processing unit is a first processor operating on a first computer system, and the second processing unit is a second processor operating on a second computer system. In some embodiments, the first processing unit is a first thread executed on a multi-threaded processor, and the second processing unit is a second thread executed on the multi-threaded processor.

Some example embodiments are directed to a computer-implemented method for analyzing a computer model of an airplane assembly. The computer model of the airplane assembly may be obtained from computer memory storage or a remote computer. The airplane assembly may include a set of components that defines at least a portion of an aeronautical surface of the airplane. A job set may be created comprising a group of tasks. The group of tasks may include tasks for: constructing a nominal solid model for each component of the set of components; constructing a nominal mesh of discrete elements for each nominal solid model; constructing a delta solid model for at least one component of the set of components; constructing a delta mesh of discrete elements for the delta solid model and at least one nominal solid model; and/or performing an analysis using either or both of the nominal mesh or the delta mesh.

In some example embodiments, a subset of common tasks is identified within the group of tasks. A processing queue may be constructed, the processing queue having a task order that has the subset of common tasks prioritized with respect to other tasks in the processing queue. The tasks of the processing queue may be executed on a processing unit in accordance with the task order. In some example embodiments, the subset of common tasks includes the at least one nominal solid model and at least one other nominal solid model.

In some example embodiments, the method also includes identifying a first group of tasks within the processing queue that can be executed independent of a second group of tasks within the processing queue. The first group of tasks may be executed on the processing unit, and the second group of tasks may be executed on another processing unit that is distinct from the first processing unit.

Some example embodiments are directed to a computer-implemented method for analyzing a three-dimensional computer model. A runtime script may be obtained from a user. the runtime script may have an instruction set including: first instructions for creating a three-dimensional component of the model; second instructions for positioning the three-dimensional component within an assembly of the three-dimensional computer model; and third instructions for performing computer-implemented analysis on the three-dimensional computer model. The three-dimensional component may be generated in accordance with the first instructions by implementing a computer-aided design (CAD) kernel accessed using compiled bridge code. The three-dimensional component may be positioned within the assembly of the three-dimensional computer model using the CAD kernel in accordance with the second instructions. The three-dimensional component may then be analyzed using a computer-implemented analysis module in accordance with the third instructions. A result of the analysis of the computer-implemented analysis module may be displayed to the user.

In some embodiments, the CAD kernel is an ACIS-based kernel, and the computer-implemented analysis module is a computational fluid dynamic (CFD) module. In some cases, the first instructions include: instructions for generating a first three-dimensional component by implementing the CAD kernel accessed using the compiled bridge code; instructions for generating a second three-dimensional component by implementing the CAD kernel accessed using the compiled bridge code; and instructions for merging or uniting the first and second three-dimensional components using an equation-based instruction format to create the three-dimensional component. In some cases, the first instructions include: instructions for generating a first three-dimensional object for the first three-dimensional component of the assembly; instructions for generating a second three-dimensional object for the second three-dimensional component of the assembly; instructions for assigning a first tag to a first surface of the first three-dimensional object; and instructions for assigning a second tag to the first three-dimensional object while maintaining the assignment of the first tag to the first surface. In some implementations, the computer-implemented analysis module identifies the first surface using the first tag. The computer-implemented analysis module may perform a computer-implemented analysis using the first surface.

In some embodiments, the computer-implemented analysis module computes one or more of: a volume-type constraint; a protrusion-type constraint; or a thickness-type constraint.

In some embodiments, the first instructions are interpreted using a bridge layer that translates the first instructions for generating the three-dimensional component for implementation by the CAD kernel. In some implementations, the compiled bridge code includes a first layer of software objects that function as wrappers for an advanced programming interface of the CAD kernel. The bridge layer may include a smart object that is configured to receive a first set of parameters specified by the first instructions from the runtime script. The smart object may be configured to pass the first set of parameters to the CAD kernel using the first layer of software objects. In some cases, the first set of parameters are one or more of: a location of the three-dimensional component or a dimension of the three-dimensional component. The kernel instructions may include one or more calls to an advanced programming interface (API) of the kernel.

Some example embodiments are directed to a computer-implemented method for generating a three-dimensional computer model. A script comprising a set of script instructions for creating the three-dimensional computer object may be obtained. The set of script instructions may be executed using one or more processing units. The set of script instructions include instructions for executing a first instruction to create a first geometric object, the first instruction including a geometry-creation command to be implemented using a computer-aided design (CAD) kernel and including a set of parametric constraints, the first geometric object defining a first geometric feature. The set of script instructions may also include instructions for executing a second instruction to create a modified first geometric object, the second instruction including a feature-manipulation command to be implemented using the CAD kernel and including a reference to the first geometric feature. The set of script instructions may also include instructions for executing a third instruction to create a second geometric object, the third instruction including a direct-modeling command to be implemented using the CAD kernel and including a reference to the modified first geometric object and a third geometric object. The computer-implemented method may also cause the three-dimensional computer model to be displayed on a display after the second geometric object has been created.

In some implementations, the set of script instructions implement commands using a compiled bridge layer. The set of script instructions may be performed without displaying the three-dimensional computer model.

In some embodiments, the geometry-creation command specifies a shape primitive, and the set of parametric constraints define a size of the shape primitive. In some embodiments, the shape primitive is an extruded solid defined by a profile shape, and the set of parametric constraints define a size dimension of the profile shape.

In some embodiments, the feature-manipulation command specifies the first geometric feature created by the geometry-creation command, and the feature-manipulation command creates a second geometric feature that is defined, at least in part, by the first geometric feature. In some embodiments, the feature-manipulation command includes a command that converts a set of edges of the first geometric feature to a set of rounded edges having a defined radius of curvature. In some embodiments, the direct-modeling command specifies the third geometric object and the first geometric object. In some embodiments, the direct-modeling command includes a Boolean operation between the third geometric object and the first geometric object.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
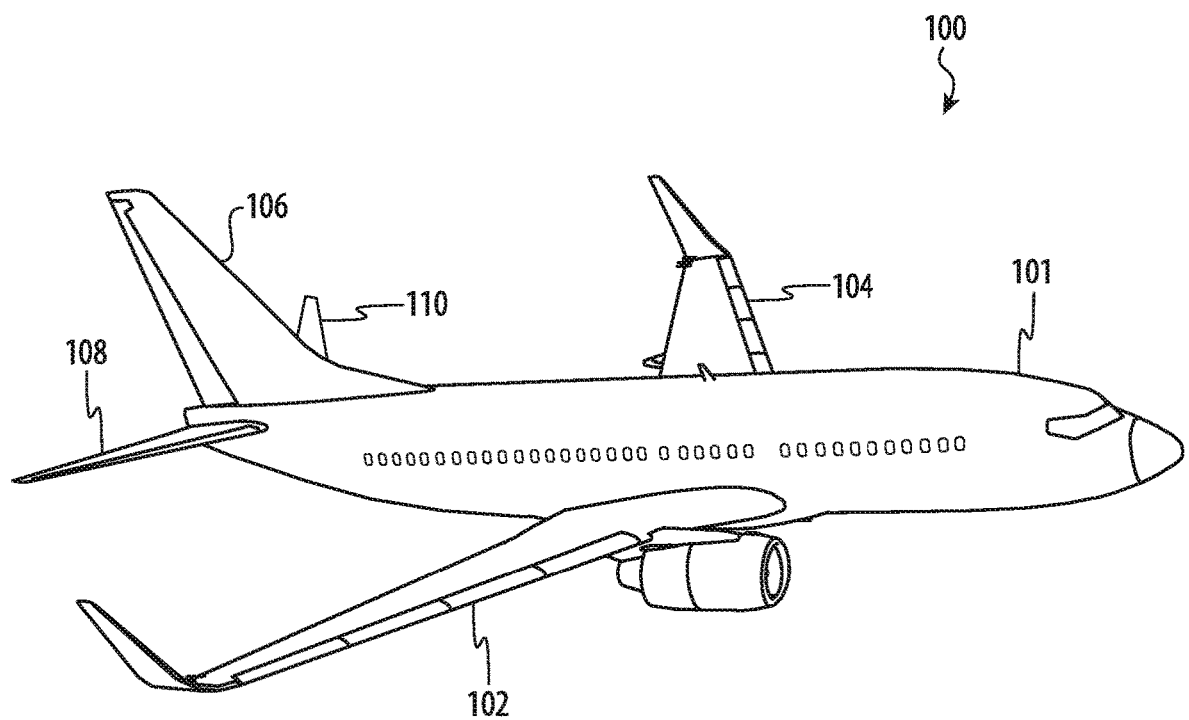
FIG. 1 depicts an example three-dimensional computer model of an airplane.

This specification describes representative or example embodiments illustrated in the accompanying drawings. The following description is not intended to limit the scope of this disclosure to the specific embodiments to one preferred embodiment. To the contrary, the described embodiments are intended to serve as illustrative examples of the subject matter defined in the claims, which may cover alternatives, modifications, and equivalents to the example embodiments described herein.

The following disclosure relates to systems and techniques for computing and analyzing a computer model. More specifically, the embodiments described herein are directed to accessing low-level or kernel-level computer modeling tools using an un-compiled scripting language. Embodiments described herein are further directed to using this architecture to implement multiple technical improvements to computer-aided modeling and design. The following techniques may be particularly beneficial for modeling and analyzing computer-modeled aircraft. However, some of the techniques may be applicable to non-aircraft designs and may be particularly well suited for designs having complex geometry, nested assembly structures, and/or iterative design analysis.

As described herein, the techniques may include the use of a script-based or programmatic scheme that is used to create, modify, and analyze three-dimensional computer models without the use of a traditional graphical user interface. The script-based techniques may create and modify geometry using a specified computer-aided design (CAD) modeling kernel. The script-based techniques provide access to powerful tools available through the CAD modeling kernel while also providing an adaptable and easy to use set of commands. In some cases, an un-compiled or runtime compiled script is agnostic as to the CAD kernel and can be adapted to use any one of a variety of different CAD kernels.

One aspect of the disclosure is directed to accessing a CAD modeling kernel using an un-compiled script or instruction set through an intermediate bridge layer. As described in more detail below, compiled computer objects written in C++ or another programming language may be used to form a bridge layer or functional interconnection between the un-compiled script and the CAD modeling kernel. The bridge layer may be called by one or more instructions from the script or instruction set and translate the script instructions into functions that are performed using the CAD kernel. The bridge layer may execute the script instructions by using an Advanced Programming Interface (API) that is adapted for the particular CAD kernel. This architecture or modeling framework enables the end user to create and modify geometry using any one of a number of different modeling techniques. As described in more detail below the end user may be able to specify in a single script, geometry-creation commands, feature-manipulation commands, and direct-modeling commands. The script may also include analysis commands that can be used to evaluate or analyze a three-dimensional model that is created using the same script. The script-based techniques described herein may also provide functionality like object tagging, object tracking, and smart objects that can be used to improve the efficiency and/or usability of a CAD modeling tool.

Using this framework, the un-compiled script or instruction set may be used to specify geometry creation, model or assembly construction, design analysis, and other computer-implemented design tasks. In some instances, the un-compiled script may be used to automate aspects of the design process. Furthermore, in some instances, an instruction set of the script may be used across multiple CAD kernels, software modeling platforms, and/or analysis tools. These and other features of the systems described herein may be difficult to accomplish using traditional CAD techniques.

One aspect of the disclosure is directed to techniques for providing a robust instruction set for creating geometric objects. In particular, a single instruction set may include instructions that span a variety of modeling paradigms or approaches. This allows a user or designer to create and manipulate geometry in an automated fashion without having to access features or geometry through a graphical user interface. This approach also provides access to the full range of CAD kernel commands without having to record keystrokes or user-interface selections using a macro or other similar technique. As described in more detail herein, a single instruction set may include a variety of CAD modeling paradigms including, for example, geometry-creation commands, parametric commands, feature-manipulation commands, feature-based commands, and/or direct-modeling commands.

As used herein, a geometry-creation command may be used to refer to a command that creates three-dimensional geometry using a CAD kernel based on a specified primitive or shape. The primitive or shape may include basic three-dimensional shapes, such as a cube, sphere, cylinder, extruded solid, revolved solid, and so on. The geometry-creation command can be used to create either solid geometry and/or surface geometry of a geometric object. The geometry-creation command can also be used to define voids or features within an existing geometric object. For example, a geometric-creation command can be used to form a hole or opening in an existing geometric object.

In some instances, the geometry-creation command includes a set of parameters that specify a dimension, a size, a location, or other constraint for the primitive or shape. If the geometry-creation command also includes one or more parameters, the command may also be referred to herein as a parametric command. As described herein, a parametric command may specify either a three-dimensional shape or a two-dimensional shape provided along with a set of parameters that either partially or fully constrain the specified shape. Example parametric commands include primitive geometry creation, revolved geometry creation, extruded geometry creation, swept geometry creation, and so on.

As used herein, a feature-manipulation command or feature-based command may be used to refer to a command that modifies or creates three-dimensional geometry or features using a CAD kernel based on a reference to existing features or geometry. Feature-manipulation commands may be particularly useful for specifying or referencing features or geometry that are/is created on-the-fly using the script or instruction set. Feature-manipulation commands may make reference to newly created geometry to create a modified geometric object or create a feature along the geometric object. Example feature-manipulation commands include a reference to a surface, a face, an edge, or other feature of a geometric object and specify an action or manipulation to be performed with respect to the referenced geometry.

As used herein, a direct-modeling command may be used to refer to a command that modifies or creates three-dimensional geometry or features using a CAD kernel based on a reference to existing geometric objects. Direct-modeling commands may be useful for creating complex geometry based on two or more existing geometric objects. As described herein, a direct-modeling command may include a Boolean command that creates a merged geometric object by adding the geometry or features from a first object to the geometry or features of a second object. Conversely, a direct-modeling command may be used to create a subtraction of a first object from a second object to define a distinct third object. Direct-modeling commands may also take an existing geometric object and create a new geometric object by revolving or sweeping the existing geometric object along a path or sweep trajectory.

Another aspect of the disclosure is directed to techniques for improving the utilization of computer resources by identifying dependencies within a computer model and the associated analysis and performing independent tasks in parallel using distinct processing units. By executing portions of the model and model analysis in parallel and reusing previously constructed portions of the model, computing resource utilization may be improved and the time to compute and analyze a model may be reduced. Task prioritization and parallel processing may be implemented using the un-compiled script (e.g., Python, Perl, or Tcl) to access the lower level or compiled CAD modeling kernel.

Another aspect of the disclosure is directed to techniques that enable the execution or computation of CAD modeling analysis, also referred to herein as constraints. The computation or analysis of constraints may be used to verify a design criteria and may also indicate the degree or magnitude to which the criteria has been satisfied. A constraint may also be used to access the sensitivity of the design to certain perturbations or dimensional variations. Example constraints include spatial gradient constraints, volume constraints, accessory constraints, and thickness constraints.

Another aspect of the disclosure is directed to techniques for performing specific operations and model construction. In particular, the modeling framework described herein may be used to implement custom model construction tools, such as custom Boolean model building tools. Other model construction tools, like curve building and custom geometry creation, may also be implemented using the modeling framework of the present disclosure.

In general, computer-aided design (CAD) can be a powerful tool that can be used to create and evaluate multiple design alternatives or iterations. The use of a CAD-based analysis may be particularly beneficial when designing and testing airplanes or aeronautical equipment as it may allow for rapid design validation and optimization without the need to build a physical prototype or model. Additionally, the design of structural elements of an airplane or aeronautical equipment may require evaluation of a large number of design alternatives in order to optimize the design for a given set of constraints. Traditionally, these multiple design alternatives may be specified by the engineer or designer, modeled, and then analyzed using computer modeling and computer model analysis tools. However, for assemblies with a large number of parts or complex geometry, creating and analyzing multiple design alternatives may require significant computer resources.

The systems and techniques described herein may improve the utilization of computer processing and memory resources in order to facilitate more rapid design optimization and exploration. In some implementations, a CAD kernel is accessed using an un-compiled scripting language. Using an un-compiled scripting language such as Python, Perl, or Tcl, an end user can construct a modeling and analysis routine that is targeted to a particular solution or evaluation without having to engage in traditional CAD modeling activities. For example, the end user can create geometry, evaluate constraints, compare constraint output to criteria, and perform another design cycle without having to view the model or interact with a traditional CAD graphical user interface.

For purposes of this disclosure, the term "script" may be used to refer to a program or instruction set that is un-compiled or compiled at runtime (e.g., a runtime script). Generally, a script includes a set of instructions that is interpreted at runtime rather than being pre-compiled in order to be executed. By way of example, a script, as used herein, may refer to a set of steps or operations in a design and analysis sequence that call on one or more underlying CAD kernels or computer-aided analysis software tools. A script may be implemented using, for example, Python, Tcl, Perl, and other suitable scripting languages. The script may specify the creation of the model geometry, manipulate the geometry, and perform the design analysis. As described herein, the use of scripts enables multiple design iterations to be performed in an efficient manner by allowing the end user to specify a sequence of complex analyses without having to recreate repeated steps or groups of operations. The use of scripts may also enable task prioritization and parallel processing, which may increase the computing efficiency of the CAD computing system. Furthermore, the use of scripts may enable the user to create and evaluate geometry without having to interact with a traditional graphical user interface.

With respect to the following disclosure, a script (e.g., runtime script) is adapted or configured to instruct operations that are performed using a geometric modeling kernel, also referred to herein as a CAD kernel. In general, a CAD kernel includes compiled software that can be used to create three-dimensional model geometry. The three-dimensional model geometry may include boundary-representations, surface models, solid models, and other computer-generated geometry representations. The three-dimensional model geometry may be defined using parametric constraints or other techniques for specifying the spatial relationships between elements. Example CAD kernels include ACIS, Parasolid, CGM, Granite, OpenCASCADE, and other similar modeling kernels. Typically, a CAD kernel includes object-oriented software that may be integrated with some traditional CAD software programs. In contrast to traditional CAD software, the present techniques enable access to geometry-creating CAD kernels without having to compile software. This provides several advantages, including, for example, a platform-independent design and analysis tool. The present techniques may also enable geometry creation and manipulation without using a graphical user interface associated with traditional modeling systems. As described in more detail herein, using a script to access a CAD kernel also facilitates task prioritization and parallel processing when performing a design analysis, as discussed herein.

As described in more detail below, the system may include compiled bridging code or a bridge layer that enables a script to manipulate and instruct the CAD kernel. The bridging code or bridge layer may include one or more compiled C++ modules that function as software wrappers for the CAD kernel and enable communication of data, parameters, and other information between the script and the CAD kernel and back. In some cases, the bridging code or bridge layer is also configured to reconcile differences in object pointers and other data objects that may exist between the CAD kernel and the script. The bridging code or bridge layer may be configured to curate or provide special handles to the CAD kernel, which may simplify the interaction with the underlying CAD kernel while also providing powerful functionality.

While the script may be implemented through one or more layers of compiled bridge code to access a CAD kernel, the script or un-compiled instructions set may still be described as having direct control over the CAD kernel. Typically, compiled bridge code translates the instructions of the script to invoke or execute the kernel. In contrast with traditional CAD modeling software tools, which may enable some level of automation or macro generation, the proposed technique functions as the primary user interface to the CAD kernel. By way of example, a traditional CAD modeling software tool typically includes a complete graphical user interface that may use various menus, buttons, and other graphical objects to enable the user to access the underlying CAD kernel. In contrast, the script instructions of the proposed technique may provide the primary interface for the user to create and/or manipulate geometry and there may be no or substantially no graphical user interface controls that are used to control or instruct the CAD kernel.

As described herein, the proposed architecture may be used to implement complex design analysis that may include iterative computational analysis. In some example embodiments, a computer model is constructed using a baseline or nominal set of parameters, which may be referred to herein as a "nominal model." The computer model may be a solid model, surface model, or other similar geometric representation of the components of the assembly. The computer model may be used to create a surface representation, boundary representation, finite element, or other similar form of the component geometry. This representation of the model may be generally referred to generically as a "mesh." The mesh may be analyzed with respect to a set of design constraints that may include surface area constraints, volumetric constraints, interference constraints, minimum clearance constraints, and so on. Depending on the outcome of the analysis, the baseline or nominal set of parameters may be modified, incremented, or varied and a modified or alternative computer model may be constructed and evaluated with regard to the constraints. As used herein, the modified, incremented, or alternative model may be referred to as a "delta model." In some cases, multiple iterations of this process may be performed in order to optimize, refine, or otherwise analyze the design.

When computing multiple design iterations to analyze a design, there may be redundant or duplicative computations that are performed during the construction and/or analysis of the computer models. In accordance with some embodiments, independent computing tasks and/or reusable elements are identified and those tasks are performed in a sequence that may improve the utilization of available computer resources. In accordance with some embodiments, the independent computing tasks are performed in parallel using distinct or separate processing units and/or multi-threaded processors, which may also improve resource utilization and/or computer analysis time.

The systems and techniques described herein may be used to evaluate a group of tasks to be completed in a given iteration loop or analysis and identify dependencies between the various tasks. Tasks that have shared or redundant dependencies or dependent tasks are identified and an optimized processing order may be constructed and executed on multiple processing units in parallel. By reducing the number of overall computations and executing tasks in parallel when appropriate, the computing resources necessary to evaluate a design or perform an optimization routine may be reduced.

For purposes of illustration of the principles of certain techniques, certain examples are described with respect to a particular design evaluation or optimization. However, these examples are merely provided to demonstrate how the various techniques may be implemented and are not intended to be limiting in nature. For example, many of the examples provided herein are described with respect to a design optimization that includes multiple iterations or evaluations of a model and a given set of constraints. However, in order to practice the techniques described herein, it is not necessary that an iterative design optimization be performed or even that multiple iterations or design evaluations be implemented.

In some example embodiments, a job set or group of tasks to be performed may be constructed or obtained. The job set may include all of the tasks and subtasks from which the tasks depend. Using the job set and the identified dependencies and interrelationships between the various tasks, an execution queue may be constructed that orders shared or fundamental subtasks earlier in the execution sequence.

Independent groups of tasks may also be identified and assigned to multiple processors or processing units to be executed in parallel.

These and other embodiments are discussed below with reference to FIGS. 1-12. However, the detailed description with respect to these figures is for explanatory purposes only and should not be construed as limiting.

The system and techniques described herein are particularly useful for constructing and evaluating aeronautical designs. Aeronautical structures, by their nature, typically involve complex geometries and interdependencies that require significant computing resources to render and evaluate. Furthermore, small changes to an aeronautical design may have a significant impact on performance and, therefore, design optimization involving the evaluation of a large number of design alternatives is a powerful technique.

The following example is provided with respect to the design of different types of aircraft, as depicted in FIGS. 1-7B. The aircraft examples are provided as an illustrative example and are not intended to be limiting in nature. While the following techniques may be particularly relevant or useful for the design of airplanes, the principles and techniques may also be extended and applied to the design of other types of aeronautical equipment, machinery, vehicles, mechanical systems, or products.

FIG. 1 depicts an example three-dimensional computer model. More specifically, FIG. 1 depicts a computer model of a commercial jet airplane. As shown in FIG. 1, the computer model 100 includes an assembly of various components and mechanical subsystems that form the airplane. For purposes of the following discussion, the components may include a fuselage 101 that forms the main body of the airplane and is connected to a left (port) wing assembly 104 and a right (starboard) wing assembly 102. The model 100 also includes a vertical stabilizer 106 and horizontal stabilizers 108, 110 positioned toward the aft end of the airplane.

The various components of the model 100 may be attached, coupled, or otherwise constrained with respect to each other to form a unitary or singular assembly referred to generally as the airplane or airship. The various components of the model 100 may also be formed from multiple components, subassemblies, or modules, which may also be formed from multiple components and so on. In many cases, all of the components or parts of the model 100 may be defined with respect to a hierarchical tree or set of assemblies and subassemblies that are members of their respective assemblies. This hierarchical configuration may facilitate the design process by allowing the different portions of the airplane or model to be designed or analyzed separately without having to work with the entire model 100. Also, as explained in more detail below, the hierarchical configuration of the model 100 may also be used to identify dependencies between different assemblies, subassemblies, and components, which may be used to improve the construction and analysis of the model 100.

In general, the model 100 may also include various constraints, parameters, properties, and/or relational definitions that help to define the airplane and/or the computer-simulated environment. For example, components or assemblies may include material properties, surface properties, colors, or other properties that may be used to predict how the components will interact with each other and with the computer-simulated environment. The components or assemblies may also be related or constrained with respect to each other in order to simulate how the airplane may respond to flight conditions, environmental factors, or other scenarios. These elements of the model 100 may not be represented by specific components or component geometry but may improve the accuracy or reliability of the model 100. As explained in more detail below, the constraints, parameters, properties, and/or relational definitions of the model 100 may be used to evaluate the performance or merit of a particular design.

The model 100, including the components, subassemblies, and assemblies, may be generated using a CAD kernel under the direction of an un-compiled script or instruction set. As described herein, an un-compiled script or instruction set may be used to refer to instructions or a program that are/is compiled or executed at run time, as compared to a compiled program or code that is converted into executable form prior to being stored in computer memory.

In general, each component is a three-dimensional model, which may be specified as a boundary representation (B-rep or BREP), surface model, solid model, or other type of three-dimensional representation. The generation of the geometry of each component may be specified by an un-compiled script or instruction set which specifies the type of geometry to be created and various parameters used to constrain or define the specific geometry. The un-compiled script or instruction set may also specify the component's placement within the model 100 by specifying positional coordinates and/or parametric constraints with respect to other components within the model. In general the un-compiled script or instruction set may include a series of commands that may combine a variety of modeling paradigms or techniques. The un-compiled script or instruction set may include one or more, geometry-creation commands, parametric commands, feature-manipulation commands, feature-based commands, and/or direct-modeling commands. As described in more detail with respect to FIG. 11, the un-compiled script or instruction set may direct the CAD kernel through a bridge layer, which may include compiled C++ code.

In some implementations, a first un-compiled script or instruction set may instruct a kernel to create or define the geometry for the components of the left (port) wing assembly 104 and specify the constraints for positioning each component of the wing with respect to a reference point or relative component. The instructions may call or may be implemented by a bridge layer or bridge code that serves as an interface to the CAD kernel. Similarly, a second un-compiled script or instruction set may instruct a kernel to create or define the geometry for the components of the right (starboard) wing assembly 102. Additional scripts or instruction sets may instruct the creation of another subassembly and yet another script may specify the positional relationship or constraints between the various subassemblies. The number of separate scripts may depend on the implementation and, in some cases, a single script may be used to generate the model 100.

An un-compiled script or instruction set may also be used to generate tags or labels that can be attached to specific geometry of a component. A tag may be associated with a surface or other geometric element of a component, which may be referenced or used to identify geometry as a group by downstream analysis tools. By way of example, a particular tag may be associated or attached to the upper exposed surfaces of each component of the right (starboard) wing assembly 102. The tag may then be used to identify those surfaces when conducting a fluid flow analysis or other type of analysis on the right (starboard) wing assembly 102 by a downstream process or module.

The tag or label may correspond to elements or attributes that are available in underlying CAD kernel framework. For example, the tag or label may correspond to an element or attribute in an ACIS-defined geometry. Furthermore, the tags or labels may be specified by the script or instruction set and created using the CAD kernel, which may create, for example, the ACIS geometry.

The attachment or specifying of tags or labels may be conducted in any one of a number of different ways. For example, in some implementations, the tags or labels may be specified at a component level. In that case, a specified tag or label is assigned to all of the geometry (e.g., surfaces) for that particular component. Tags or labels may also have a hierarchy such that a surface or geometric element already having a tag will retain that tag unless otherwise directed. This allows the script or instruction set to tag or label certain key or important geometry first and then tag or label all other geometry or surfaces without undoing previous tag assignments. Furthermore, the tags or labels may survive manipulation or modification of the geometry or component. In some cases, the tags or labels may pass through or remain attached to geometry modified using merge or Boolean operations (described in more detail below with respect to FIGS. 4B-4C).

Use of a script-based modeling architecture may also facilitate the use of classes of geometry that may be specified or manipulated by a set of curated properties. Geometry that may be specified this way may be referred to as "smart objects" or "custom primitives." In general, a script or instruction set may call a smart object, which may be used to generate or modify geometry using a selected or curated set of properties or parameters. By way of example, a CAD kernel (e.g., an ACIS kernel) may specify classes for curves, surfaces, and other types of geometric objects. When these geometric objects are created, the instantiated objects have properties that may be modified or specified by a method. Using a smart object that may be implemented as part of a bridge layer (see, e.g., 1104 of FIG. 11), the properties of the instantiated object may be made accessible to the script. That is, the script may instruct the creation or modification of an instantiated object by specifying values for the properties made available through the smart object. In some cases, the bridge layer or bridge code includes a smart object that is configured to receive a first set of parameters specified by instructions from the script. The smart object may be configured to translate the first set of parameters into kernel instructions (e.g., one or more API calls of the kernel) for generating a geometric object for a component.

The ability to modify geometry through smart objects may provide a powerful tool to the end user specifying the instruction set or script. For example, this functionality may allow an end user to access the hierarchy of geometric objects used to generate a particular component or subassembly. By having direct access to the geometric objects through the smart object, the user may, through the script, access the geometric object property history and construction without having to explicitly store the information. This may simplify the script and enable the end user of the script to create complex geometric components by accessing elements (e.g., a particular geometric object) of an existing component and utilize those elements to create new geometry.

In one example, a component may be defined, in part, by a circle (example geometric object). Using a smart object, a script may access the various properties or parameters associated with the circle, including, for example, the radius and center location. Using the script, the properties or parameters of the circle may be scaled, transformed (translated or rotated), or otherwise modified by manipulating the values of the properties made accessible through the smart object. The circle of the component may be used to create or define circular geometry on other components. While the creation of a circular geometry (with or without a smart object) may be relatively straightforward, the ability to leverage existing geometric elements using a smart object may be a powerful tool when working with complex geometries, like airfoil profiles, nacelle profiles, or the like. Using smart objects, complex geometry (or geometry that is difficult to produce from scratch) may be leveraged throughout a design or across designs using a script that is able to access the properties or parameters of the geometry through a smart object.

These and other examples are described below with respect to FIGS. 2-4C. In particular, a script-based modeling technique can be used to create and analyze a three-dimensional computer model. while the following examples are described with respect to an aeronautical design (e.g., aircraft), similar techniques may be applied to create, modify, and analyze geometry for a variety of different applications, including, for example, automotive applications, machinery applications, and other products or components.

Figure 2:
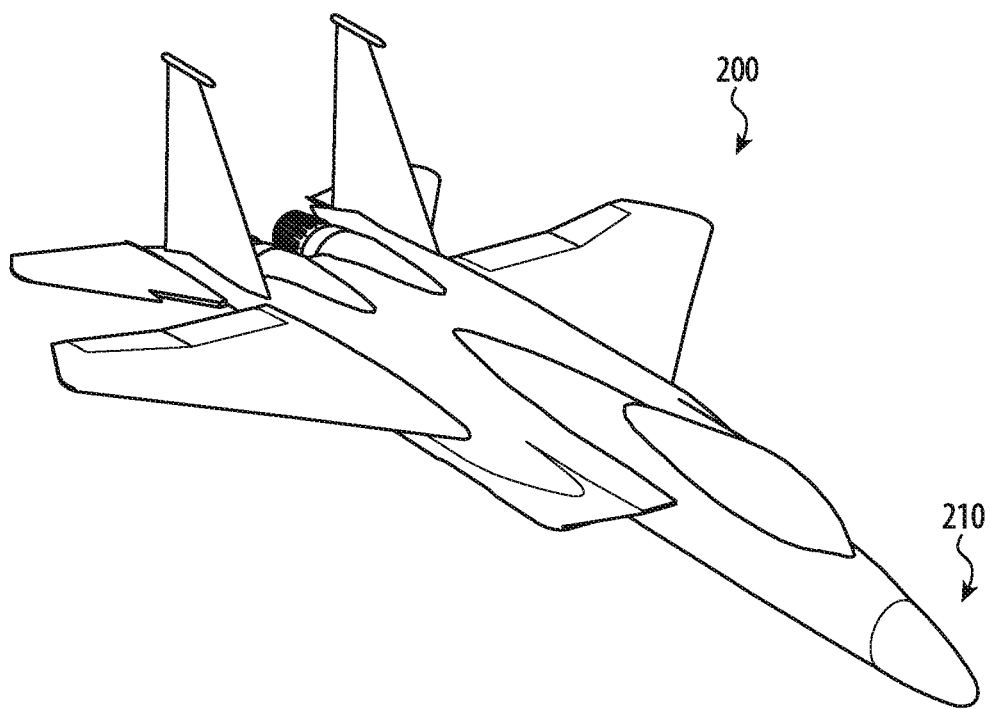
FIG. 2 depicts another example three-dimensional computer model of an airplane.

FIG. 2 depicts another example three-dimensional computer model of an airplane. In particular, FIG. 2 depicts a military-style aircraft represented by a three-dimensional computer model 200. Similar to as described above with respect to FIG. 1, the model 200 includes an assembly of various components and mechanical subsystems that form the aircraft assembly. The various components of the model 200 may be attached, coupled, or otherwise constrained with respect to each other to form a unitary or singular assembly referred to generally as the (aircraft) model 200. The various components of the model 200 may also be formed from multiple components, subassemblies, or modules, which may also be formed from multiple components and so on. As discussed previously, all of the components or parts of the model 200 may be defined with respect to a hierarchical tree or set of assemblies and subassemblies that are members of their respective assemblies.

The model 200, including the components, subassemblies, and assemblies, may be generated using an un-compiled script or instruction set that accesses a CAD kernel. As described herein, the un-compiled script or instruction set may access the CAD kernel through call to a bridge layer or bridge code. In accordance with the following embodiments, an un-compiled script or instruction set may be used to refer to instructions or a program that are/is compiled or executed at runtime rather than being converted into executable form prior to being stored in computer memory.

Various components or elements of the model 200 may be created using a set of instructions specified in a scripting language, such as Python, Tcl, Perl, or another similar script-based programming language. As described below with respect to FIGS. 3A-3E, the un-compiled script or instruction set may implement or utilize multiple modeling paradigms or modeling techniques in a single script. Specifically, the un-compiled script may include one or more, geometry-creation commands, parametric commands, feature-manipulation commands, feature-based commands, and/or direct-modeling commands.

FIGS. 3A-3E depict an example modeling sequence for forming the fore-section or nose 210 of the aircraft represented by model 200. A similar approach may be used to construct or define various other elements or components of the model 200. The following example is provided merely as an example and represents only a portion of an example set of script instructions. In some embodiments, the geometry creation script used to create the nose 210 may be combined with other instructions for creating other components, instructions for evaluating one or more constraints, and/or instructions for performing other types of computer analysis. Furthermore, the scripting example of FIGS. 3A-3E may be performed as part of a sequence of tasks specified in a job set and executed in parallel, as described in more detail below with respect to FIGS. 8-10C.

Figure 3A:
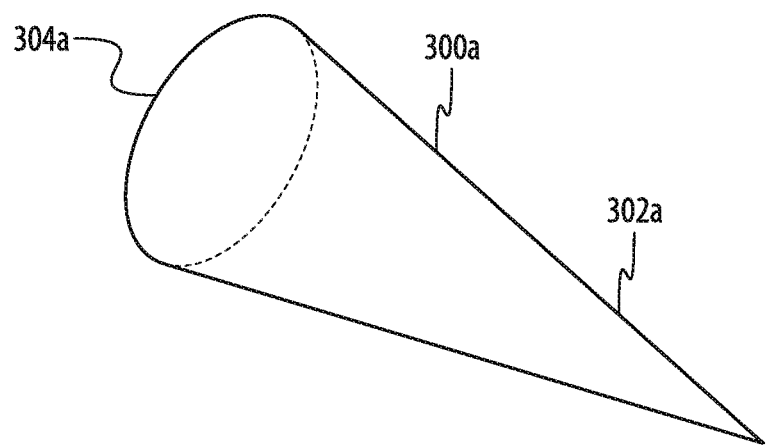
FIG. 3A depicts an example geometric object created using a geometry-creation command.

FIG. 3A depicts an example geometric object created using a geometry-creation command. In particular, FIG. 3A depicts an example cone-shaped object 300a that forms the foundation of the fore-section of the aircraft depicted in FIG. 2. In this example, the cone-shaped object 300a (example first geometric object) may be created using an un-compiled script that includes a set of instructions including a geometry-creation command. In this example, the geometry-creation command invokes an operation performed by a CAD kernel and includes a set of parametric constraints. In accordance with the embodiments described herein, the geometry-creation command accesses or implements a CAD kernel command or action through a bridge layer or bridge code, as described in more detail below with respect to FIG. 11.

In general, a geometry-creation command may be used to refer to a command that creates three-dimensional geometry using a CAD kernel based on a specified primitive or shape. As discussed previously, a primitive or shape may include one or more three-dimensional shapes, including, for example a cube, sphere, cylinder, extruded solid, revolved solid, and/or other similar shape. In this example, the geometry-creation command includes a set of parameters that specify a dimension, a size, a location, or other constraint for the primitive and, thus, may also be referred to as a parametric command. While the following example is provided with respect to the creation of a positive geometry creation, a geometry-creation command can also be used to define a negative geometry (e.g., voids or cut features) within an existing geometric object. For example, a geometric-creation command can be used to form a hole, cut, or opening in an existing geometric object.

As shown in FIG. 3A, the cone-shaped object 300a is a model of the base geometry of the fore-section or nose represented by a cone having dimensions specified by a set of parameters. In the following example, the set of parameters also specifies a position of the object 300a with respect to an origin or reference point. Below is an example instruction that includes an example geometry-creation command for creating the geometric object "nose_base" positioned with respect to a Cartesian origin point:

nose_base=primitive.cone((0,0,0),(1,3), which specifies the creation of a cone primitive at an origin point (0, 0, 0). The cone has a diameter of 1 unit and a length of 3 units. Thus, the set of parameters include coordinates for the location of the object 300a and dimensions or values for the size of the object 300a. The object 300a include various geometric features including, for example, cone surface 302a and base surface 304a. Other features may include the edges, points, or other geometric elements of the object 300a. For the purposes of this example, the values or units are arbitrary and may not exactly correspond to the relative size or dimensions of the example object 300a depicted in FIG. 3A.

Figure 3B:
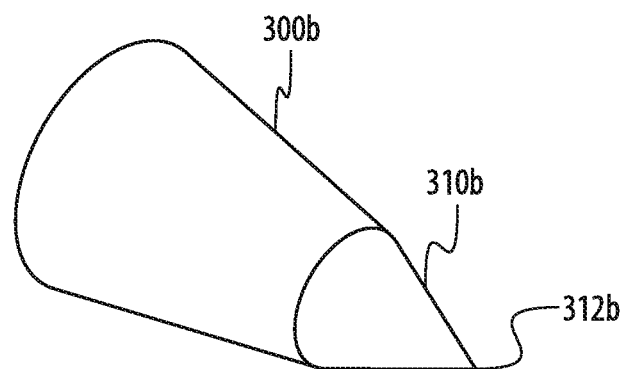
FIGS. 3B and 3C depict an example geometric object having been modified by one or more feature-manipulation or feature-based commands.
Figure 3C:
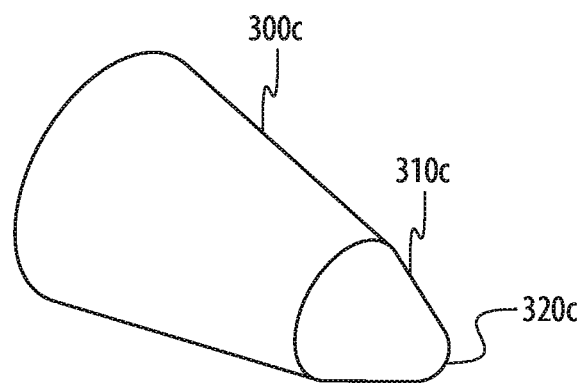

FIGS. 3B and 3C depict an example geometric object having been modified by one or more feature-manipulation commands or feature-based commands. FIG. 3B depicts an example geometric object 300b (example second geometric object) may be created using an un-compiled script that includes a set of instructions including a feature-manipulation or feature-based command. In this example, the feature-manipulation command invokes an operation performed by a CAD kernel and includes a reference to a geometric feature of the cones-shaped object 300a of FIG. 3A. In accordance with the embodiments described herein, the feature-manipulation command accesses or implements a CAD kernel command or action through a bridge layer or bridge code, as described in more detail below with respect to FIG. 11.

In general, a feature-manipulation command or feature-based command may be used to refer to a command that modifies or creates three-dimensional geometry or features using a CAD kernel based on a reference to existing features or geometry. As mentioned previously, feature-manipulation or feature-based commands may be particularly useful for specifying or referencing features or geometry that are based on geometry created on-the-fly using the script. A feature-manipulation command generally references a geometric element or feature of and object and an action to be performed relative to the specified geometric element or feature.

Below is an example instruction that includes an example feature-manipulation or feature-based command for creating the geometric object "tapered_nose" having an inward draft applied to the outer cone surface:

tapered_nose=feature.draft.inward(nose_
base.cone_surface,2,15degrees), where the feature-manipulation or feature-based command is a command to create an inward draft along the feature "cone_surface" of the object "cone_base", which corresponds to cone surface 302a of object 300a, depicted in FIG. 3A. In this example, the inward draft is 15 degrees and has a length or starting position of 2 units from the tip of the nose base. As shown in FIG. 3B, the feature-manipulation or feature-based command results in an object 300b having a tapered surface 310b and end point 312b.

FIG. 3C depicts an example geometric object 300c (example third geometric object) that may be created using an un-compiled script that includes a set of instructions including another feature-manipulation or feature-based command. Similar to the previous examples, the feature-manipulation command invokes an operation or functionality performed by a CAD kernel and includes a reference to a geometric feature of the object 300b of FIG. 3B and may access or implement a CAD kernel command or action through a bridge layer or bridge code.

Below is an example instruction that includes an example feature-manipulation or feature-based command for creating the geometric object "rounded_nose" having an inward draft applied to the outer cone surface:

rounded_nose=feature.round(tapered_nose.end_point,
0.5), where the feature-manipulation or feature-based command is a command to create a round at a point or edge. The command references the feature "end_point" of the object "tapered_nose", which corresponds to end point 312b of object 300b, depicted in FIG. 3B. In this example, the round has a radius of 0.5 units. As shown in FIG. 3C, the feature-manipulation or feature-based command results in an object 300c having a tapered surface segment 310c and a rounded end surface 320c.

Figure 3D:
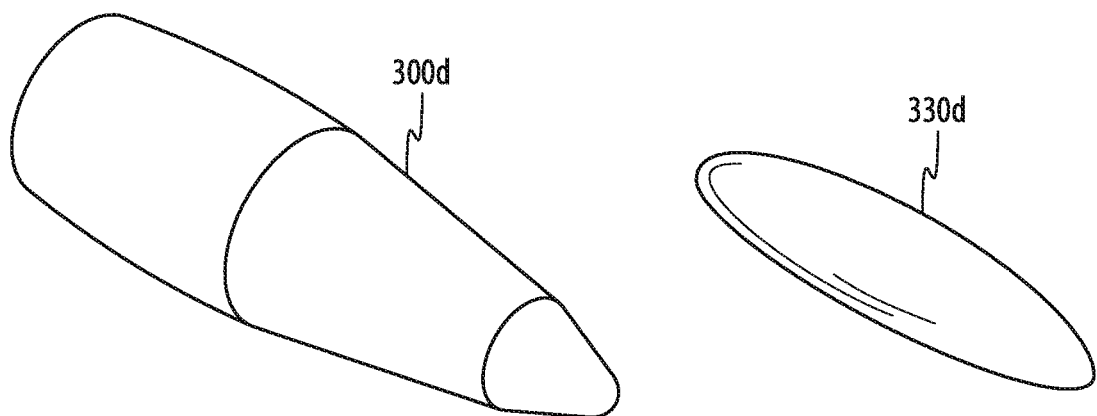
FIGS. 3D and 3E depict an example geometric object having been created using a direct-modeling command.
Figure 3E:
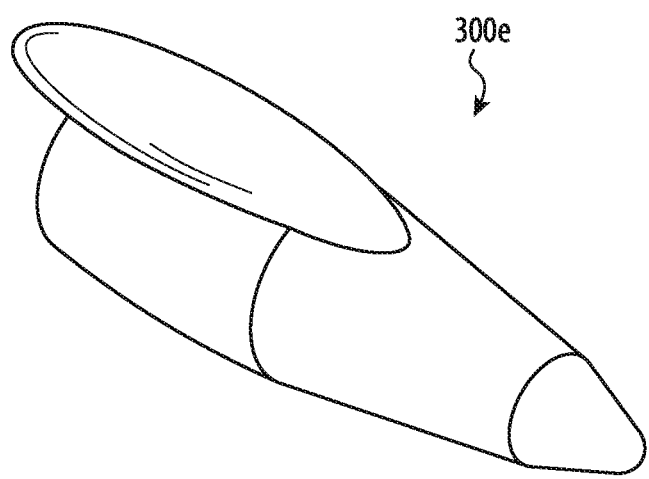

FIGS. 3D and 3E depict an example geometric object having been created using a direct-modeling command. In particular, FIG. 3D depicts example geometric objects 300d and 330*d* that represent different sections of the fore-section or nose of the aircraft. The geometric object 300*d* corresponds to the rounded nose 300*c* discussed above with respect to FIG. 3C. The geometric object 330*d* corresponds to the geometry of a canopy section positioned around the cockpit of the aircraft. The two geometric objects 300*d*, 330*d* may be created using a script-based technique, similar to as described above with respect to FIGS. 3A-3C or, alternatively, the geometric objects 300*d*, 330*d* may have been created using another technique, stored and then later imported or obtained from computer memory.

FIG. 3E depicts an example geometric object 300*e* that may be created using an un-compiled script that includes a set of instructions including a direct-modeling command. Similar to the previous examples, the direct-modeling command invokes an operation or functionality performed by a CAD kernel and includes a reference to the two geometric objects (e.g., 300*d*, 330*d*). Similar to the other modeling commands, the direct-modeling command may access or implement a CAD kernel command or action through a bridge layer or bridge code.

In general, a direct-modeling command may be used to refer to a command that modifies or creates three-dimensional geometry or features using a CAD kernel based on a reference to existing geometric objects. As discussed previously, direct-modeling commands may be used to create complex geometry based on two or more existing geometric objects. As described herein, a direct-modeling command may include a Boolean command that creates a merged geometric object by adding the geometry or features from a first object to the geometry or features of a second object. Similarly, a direct-modeling command may be used to create a subtraction of a first object from a second object to define a distinct third object. Other direct-modeling commands may create a new geometric object or geometry by revolving or sweeping an existing geometric object along a path or sweep trajectory.

In this example, the direct-modeling command includes a Boolean operation between the two geometric objects 300*d* and 330*d*. More specifically, the direct-modeling command includes a merge or addition of the two geometric objects 300*c* and 330*c*. Below is an example direct-modeling command for creating the geometric object "fore-section" that represents a Boolean merge of the two geometric objects 300*d* ("rounded_nose") and 330*d* ("canopy"):

fore_section=boolean.merge(rounded_nose,canopy).

The direct-modeling command references the geometric objects "rounded_nose," which corresponds to the geometric object 300*d* of FIG. 3D and "canopy," which corresponds to the geometric object 330*d* of FIG. 3D. As shown in FIG. 3E, the direct-modeling command results in an object 300*e* having merged geometry of the two geometric objects and may correspond to a fore-section of the aircraft model 200 depicted in FIG. 2.

Figure 4A:
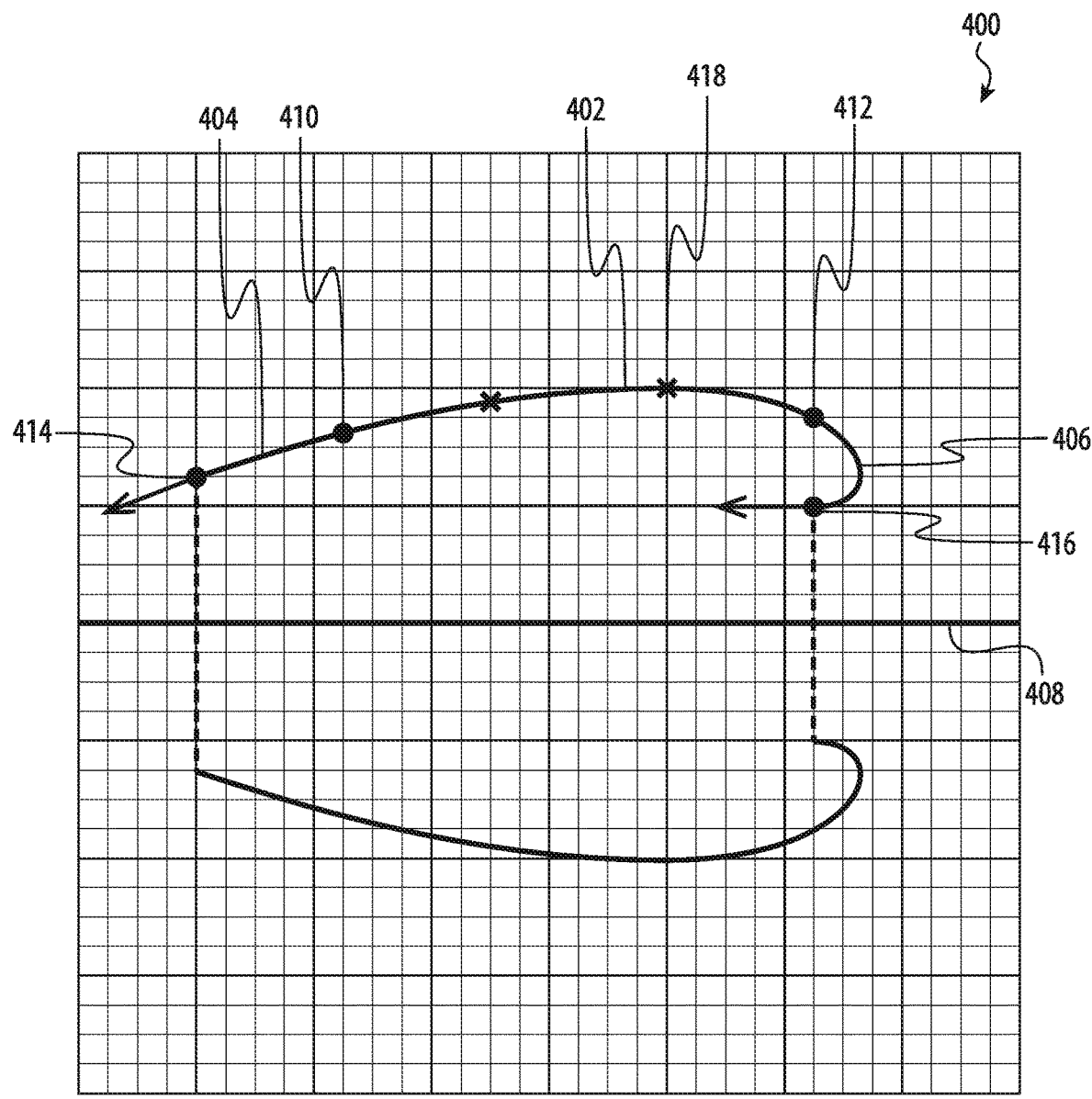
FIG. 4A depicts example geometry for a revolved shape.
Figure 4B:
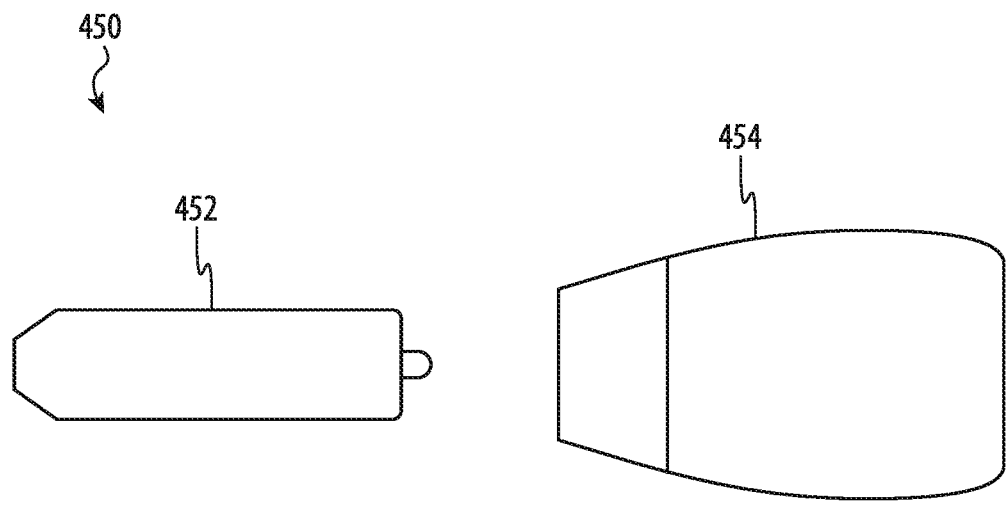
FIG. 4B depicts example components to be used in a Boolean operation.
Figure 4C:
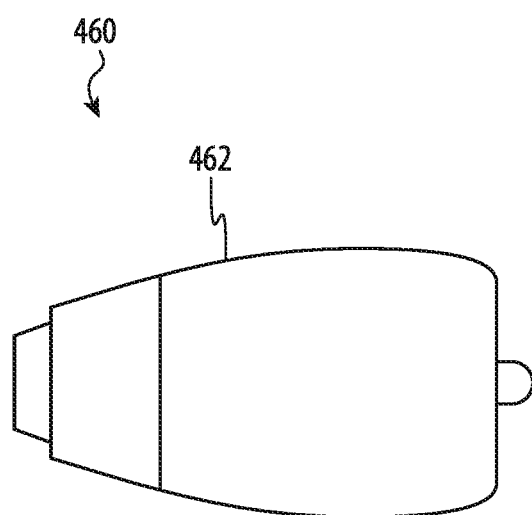
FIG. 4C depicts an example result of a Boolean operation.

FIGS. 4A-4C depict example geometric objects and components that may be created using the script-based techniques described herein. More specifically, FIG. 4A depicts an example geometric object (e.g., spline curves) used to define a component (skin for a nacelle). FIG. 4B depicts a nacelle and an engine as separate components and FIG. 4C depicts a merged component that results from an example Boolean operation.

FIG. 4A depicts an example geometric object used to define an outer surface of a nacelle component. In particular, FIG. 4A depicts a curve 400 that is revolved around sketch axis 408 to define the outer surface of the nacelle (e.g., nacelle 454 of FIG. 4B). In this example, the curve 400 includes a spline section 402 that connects curves 404 and 406 to define a smooth, continuous profile. The curve 400 is mirrored above and below the axis 408 in the example of FIG. 4A to better illustrate the resulting geometry, but depiction of the lower reflected curve is not required for purposes of defining the geometric object. In fact, using a script-based technique, as described herein, it is not necessary or even desirable that a graphical representation of the curve 400 be presented or displayed during the creation or definition of the geometric object.

As discussed above, using an embodiment of the script-based techniques described herein, properties or parameters of the curve can be made available by the CAD kernel through a bridge layer or other intermediate software interlink. A typical CAD kernel, such as ACIS, may provide a large number of curve-construction constraints and methods. The bridge layer may be adapted to pass through or enable control of a curated or selected set of parameters that can be specified by the user's script or instruction set. In some cases, the bridge or bridge layer translates or synthesizes instructions for the CAD kernel based on values or properties specified in the script. In one particular example, a smart object, similar to the example discussed above, may be used to enable a script to specify values for the various parameters or properties of the curve 400.

With regard to the example of FIG. 4A, a script may be used to define the spline section 402, which connects curve 404 and curve 406. While a typical CAD kernel may provide a large number of curve-construction parameters, there may not be parameters for specifying certain constraints, such as endpoint curvature constraints. In scenarios where the ACIS kernel does not provide for a particular parameter, a script, through a bridge layer or other intermediate software interlink or element, may translate or synthesize constraints using geometric principles or algorithms. Here, in this example, the spline section 402 is defined, in part, by a first tangent constraint between end point 410 and curve 404 and a second tangent constraint between end point 412 and curve 406. The tangent constraints may be specified through a script or instruction set through an object or other software element of the bridge layer, which translates the constraint in terms of curve-construction parameters that are used by the CAD kernel. In some instances, the object or software element of the bridge layer may include the algorithm or computation that synthesizes the constraint (e.g., endpoint curvature constraint) which is specified by the script or instruction set.

As shown in FIG. 4A, the spline section 402 may also be defined, in part, by control points 418, which may be used to control the curvature or shape of spline section 402. The spline section 402 may also be defined by other parameters associated with spline geometry, such as a NURB spline (non-uniform rational B-spline) or other type of spline definition. Additionally, curves 404 and 406 may themselves be spline curves that are defined by end points and tangent conditions. By way of example, curve 404 may be defined by end points 414 and 410 and a tangent condition indicated by the arrow extending from end point 410. Similarly, curve 406 may be defined by end points 418 and 416 and a tangent condition indicated by the arrow extending from end point 416. Other geometric objects (straight lines, curves, etc.), while not expressly depicted in the example of FIG. 4A, may also be used to complete the revolved section used to define the component.

FIGS. 4B and 4C depict example components which may be manipulated using a Boolean or other similar type of geometric creation/manipulation tools. In particular, FIG. 4B depicts an assembly 450 having a separate engine 452 and nacelle 454 components. The nacelle 454 may be generated from a revolved section, as discussed above with respect to FIG. 4A. The engine 452 may be defined using a similar section-based technique or another type of geometry-creating function available in the CAD kernel. Using the CAD kernel, the separate engine 452 and nacelle 454 components may be merged or united to create a single part. FIG. 4C depicts a result of a union operation, which merges the geometry of the engine 452 and nacelle 454 to create a union component 462. In some instances, such a merge operation is referred to as a solid body Boolean union or merge of two components or three-dimensional objects.

Uniting, subtracting, intersecting, and other Boolean operations may be made more simple and/or more intuitive using the script-based techniques described herein. In particular, a script or instruction set may specify a Boolean operation in an equation format that can then be translated into a form useable by the CAD kernel (e.g., kernel instructions or an advanced programming interface (API) of the kernel). For example, an instruction may implement a CAD kernel via a function or object defined as part of a bridge layer. An example script instruction that may invoke a CAD kernel using a Boolean operation defined within a bridge layer may be specified by the following example syntax:

boolean_operator(part1,part2), where the "boolean_operator" specifies the operation to be performed (union, subtraction, intersection) and "part1" and "part2" specify which parts are being operated on. In this example, the Boolean operation defined by the bridge layer mirrors an existing kernel command of the CAD kernel. While this syntax may be native to the CAD kernel, it may not be intuitive when performing certain operations, such as subtraction operations where it may not be clear which part is being subtracted from the other. Using the script-based techniques described herein, the syntax of a Boolean operation may be adapted or constructed to be more intuitive. In some implementations, an equation construct can be specified by the script or instructions set, which may be adapted using the bridge layer, into a form used by the CAD kernel. For example, a subtraction Boolean operation defined within a bridge layer may be specified by the following syntax:

union_part=part1−part2, where "part2" is subtracted from "part1" and "union_part" is the resulting geometry. By specifying the operation in an equation format, it is more clear which part is being operated on and what the final geometry will be. In this example, a Boolean subtraction operation is represented by a minus sign ("−"). For a union operation, a plus sign ("+") may be used for the operator, and for an intersection operation, an ampersand ("&") may be used for the operator.

With respect to the example of FIGS. 4B and 4C, a script or instruction set may specify:

union_part=engine+nacelle, where a union operation is performed on engine 452 and nacelle 454 depicted in FIG. 4B. The script instruction above may be implemented through or translated by the bridge layer to invoke a kernel command having more traditional CAD kernel syntax represented as:

union(engine,nacelle), resulting in the union component 462 depicted in FIG. 4C.

The examples above are provided to illustrate how a script-based technique may be used to facilitate the creation and modification of component geometry. In general, these examples demonstrate how an un-compiled or runtime script having an instruction set can be specified in an intuitive way and then adapted or translated (via a bridge layer or other intermediate software interconnect or element) to execute a CAD kernel function or action (using, for example a kernel API). An example of this general system architecture is described below with respect to FIG. 11.

While the examples, provided above with respect to FIGS. 4A-4C, include graphical or visual depictions, there is no need for the script-based tool to display or depict these intermediate steps. In some cases, it may be beneficial to perform the operations outlined with respect to the examples of FIGS. 4A-4C without producing a graphical output until the model or geometry has been created. Furthermore, if the design involves an iterative analysis or multiple cycles, it may be beneficial to not display geometry until a final result is reached or the analysis is otherwise completed or halted.

FIGS. 5-10C depict further examples of modeling and analysis techniques that may be implemented using the script-based techniques described herein. However, while a script-based approach, such as the approach outlined in FIG. 11, may be well suited to implement one or more of the following examples, it is not necessary that the following examples be performed using that particular architecture or system.

Figure 5:
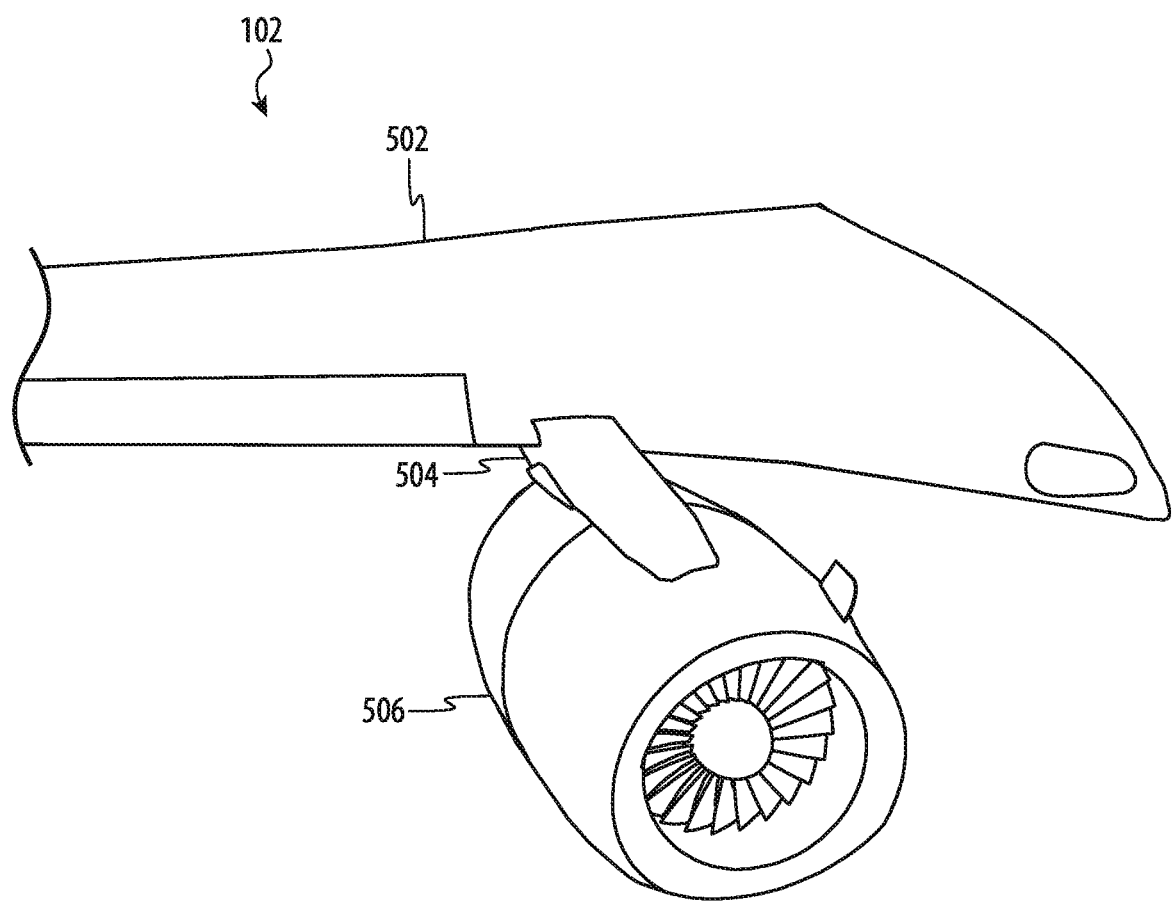
FIG. 5 depicts an example three-dimensional computer model of a wing, nacelle, and pylon of the airplane of FIG. 1.

FIG. 5 depicts an example three-dimensional computer model of a wing, nacelle, and pylon of the airplane of FIG. 1. The structure depicted in FIG. 5 includes a portion of the right (starboard) wing assembly 102 of the model 100 of FIG. 1. As shown in FIG. 5, the wing assembly 102 may include an airfoil or wing 502 and a nacelle 506 connected to the wing 502 by a pylon 504. Each of these components forms a portion of an external aeronautical surface of the airplane. Accordingly, the size, shape, and positional relationship of these components may affect the aeronautical performance of the airplane. Furthermore, each of these components may shroud or enclose various other components or subassemblies that are internal to the respective component. Thus, the internal volume or envelope defined by these components may also be an important design consideration.

With respect to the following example, the wing 502, pylon 504, and nacelle 506 are described as being discrete or singular components. However, in an actual implementation, each of the components may also include various other components, subassemblies, or modules. For example, the nacelle 506 may include multiple shrouds or skins that cooperate to form the external surface of the jet engine. Similarly, the wing 502 may include various subassemblies, including, for example, ailerons, flaps, spoilers, and winglets that form aeronautical or control surfaces of the wing 502. The various individual components, subassemblies, or modules that are included in each of the components (wing 502, pylon 504, and nacelle 506) are omitted for the sake of clarity to provide a simplified example.

As described above with respect to FIG. 1, a script-based technique may be used to tag or label the various components and/or component geometry of the wing assembly 102. As discussed previously, a tag or label may be associated with a surface or other geometric element of a component, which may be referenced or used to identify geometry as a group by downstream analysis tools. In one example, the outer exposed surfaces of the wing assembly 102 may be assigned a particular tag identifying them as being flow-directing geometry. The tag may be used to identify geometry that is analyzed using a fluid analysis module (e.g., a computational fluid dynamics (CFD) module) to determine an aerodynamic property of the wing assembly 102. Similarly, a script or instruction set may associate a particular tag with structural elements of the wing assembly 102. The tag may be used to identify geometric objects, components, and/or component geometry that is analyzed using a computer-implemented modeling tool or analysis module. Example computer-implemented modeling tools or analysis modules may include a structural analysis module or a thermal analysis module (e.g., a finite element analysis (FEA) module) that are configured to determine one or more mechanical or thermal properties of the wing assembly 102 and may use the tags to reference or identify the relevant geometry or geometric objects.

The components and/or component geometry of the wing assembly 102 may be tagged or labeled in any one of a number of different ways. For example, in some implementations, a tag or label may be assigned for the entire wing assembly 102, which will assign a specified tag or label for all of the geometry (e.g., surfaces) in the wing assembly 102. Additional tags may be assigned or attached on a component-by-component basis, an object-by-object basis, and/or a surface-by-surface basis. As mentioned previously, tags or labels may also have a hierarchy such that a surface or geometric element already having a tag will retain that tag unless otherwise directed. This allows the script or instruction set to tag or label certain key or important geometry first and then tag or label all other geometry or surfaces without undoing previous tag assignments.

As described above, each of the components, subassemblies, or modules may themselves be interrelated by a series of hierarchical relationships. These hierarchical relationships may be used to determine which components may be computed or evaluated independent of other components, subassemblies, or modules. With respect to the present example, the wing 502, pylon 504, and nacelle 506 are all members of the wing assembly 102. Similarly, the right (starboard) wing assembly 102, left (port) wing assembly 104, and fuselage 101 of FIG. 1 may be members of an airplane body or airship structure assembly.

The hierarchical configuration may be reflected in a group of tasks or a job set that may be used to define the tasks to be performed to construct and evaluate the model. With respect to the present example, the wing 502, pylon 504, and nacelle 506 of the wing assembly 102 may be represented by a surface model, solid model, parametric model, or other computer-defined geometric construction. In order to construct or build the model (e.g., model 100 of FIG. 1), each component may be computed using a CAD modeling kernel or other similar CAD construction module. In some implementations, the components and assembly constraints are specified by an un-compiled script or instruction set, which interfaces with or invokes a CAD kernel through a bridge layer (see, e.g., architecture of FIG. 11 set out below). Similar to as described above with respect to FIGS. 4A-4C, each component may be defined by a set of geometric objects (profiles, sweeps, curves, lines), object parameters, primitive shapes, or other constraints that are used to define the geometry of the component. Also, as described above, one or more smart objects may be used to define components or component geometry. Components may also be created using union, subtraction, interference, and other Boolean operations. Per instructions and parameter values set out in the script or instruction set, the CAD kernel may be configured to construct the geometry of each of the components using the various constraints used to define the geometric features of the respective component.

As discussed in more detail below with respect to FIGS. 9A and 9B, the computation of each component by the CAD kernel may be represented by one or more nodes, tasks, or items in a job set. In one example, an instruction or group of instructions in the un-compiled script may correspond to the computation or creation of a component, and that instruction or group of instructions may be represented by one or more nodes, tasks or items in the job set. In some implementations, an un-compiled script or instruction set may be used to define or create a job set having a set of tasks that are specified by the instruction set.

In some implementations, the construction and assembly of the model may be performed using a job set of tasks that may be parsed to create a processing queue. Each item in the job set may correspond to a task to be performed by the CAD kernel. For example, the tasks may correspond to the creation of a particular geometric shape or element, the addition of material or geometry to a component, the removal of material or geometry from a component, a merging of geometry between two or more components or elements, and so on. The tasks may also correspond to the assembly of the various elements or components within the model.

In accordance with the embodiments described herein, the computation or construction of each component or assembly may be performed independent of other components or assemblies in the model. As described in more detail below with respect to FIGS. 8-10C, the techniques described herein may be used to identify independent computations or constructions, which may be assigned to separate or discrete processing units and performed in parallel. By way of example, the components of the right wing assembly (102 of FIG. 1) may be computed or constructed independently from the components of the left wing assembly (104 of FIG. 1) and may be executed using separate or discrete processing units in parallel.

As described in more detail below with respect to FIGS. 7A, 7B, and 8, the size, shape, positional relationship, or other aspect of the wing 502, pylon 504, and nacelle 506 may be modified and the performance of the wing assembly 102 may be computed or analyzed. In some example implementations, multiple iterations or design alternatives are evaluated in order to optimize a particular criteria or aspect of the design. In some cases, multiple competing or related criteria are evaluated in order to determine or identify a design having an appropriate tradeoff or overall design performance. A design analysis computation that evaluates a criteria or aspect of the model may be referred to herein as a constraint.

As described in more detail below with respect to FIGS. 8-10C, the analysis or evaluation of a single model (or an iterative analysis involving a set of multiple delta models) may be specified by a script or instruction set, which may be used to define a job set. In some example embodiments, shared or redundant tasks of the job set are identified. Those tasks may be performed in advance of the analysis or evaluation of the model and may be reused between design iterations to improve the computational efficiency of the system. For example, a design evaluation that does not modify the wing 502 may compute or construct the wing 502 before constructing other components or performing an evaluation of the design. In some cases, the computer model of the wing 502 is stored in computer memory and reused for modified or delta models, which may reduce the computer resources needed for subsequent constructions or design evaluations.

In some implementations, in order to evaluate the performance of the wing assembly 102, the respective portion of the model may be converted into discrete or geometric elements that may be evaluated using an analytical tool that is intended to simulate one or more real-world conditions. For example, the model (or a portion of the model) may be converted into a boundary representation, a surface representation, a finite element representation, or other representation composed of discrete or geometric elements, which may be referred to herein generally as a mesh. As described herein, the mesh may be evaluated or subjected to an analytical tool, including, for example, a stress simulation module, a fluid simulation module, an acoustic simulation module, or other simulation or evaluation tool.

Figure 6:
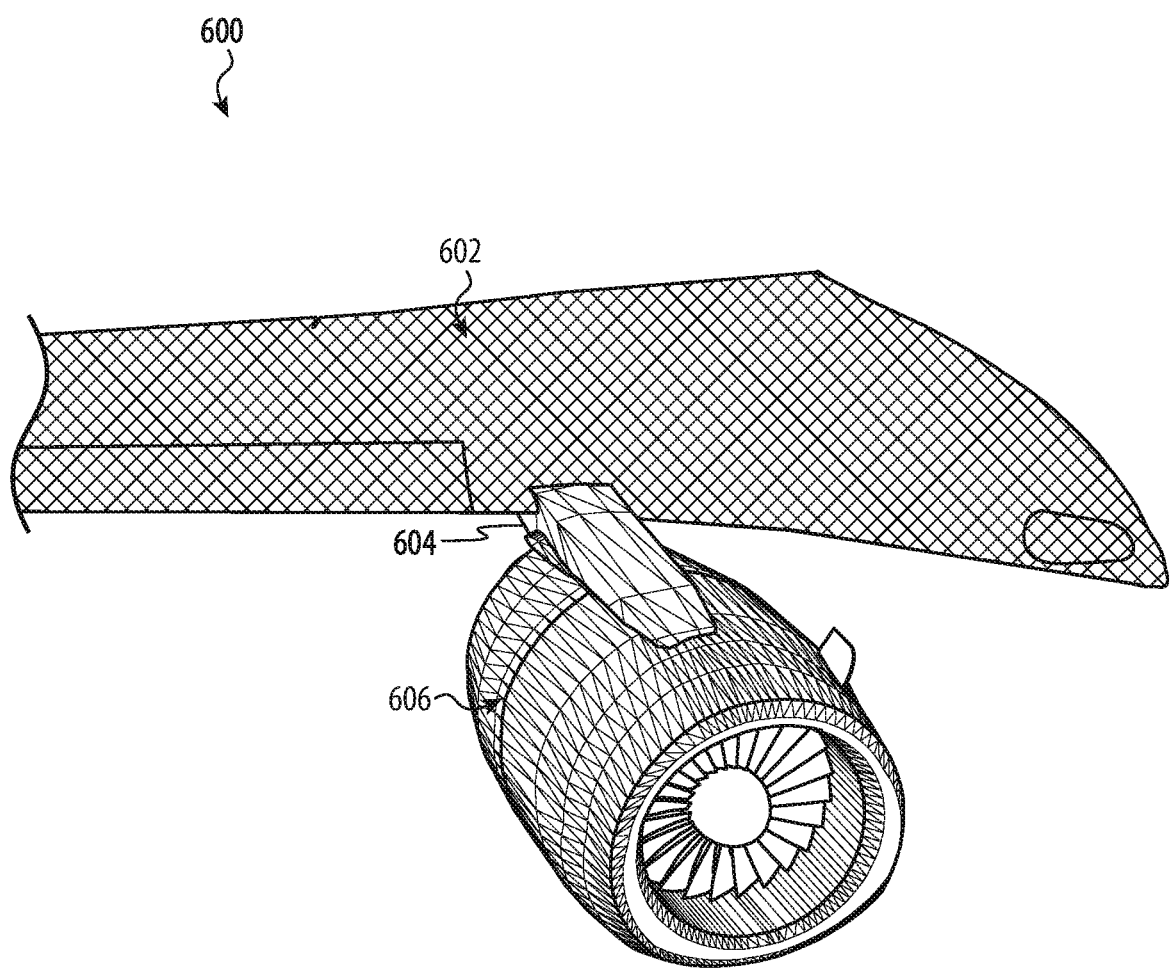
FIG. 6 depicts an example mesh of the wing, nacelle, and pylon of FIG. 5.

FIG. 6 depicts an example mesh of a wing, nacelle, and pylon of the airplane of FIG. 5. In particular, the mesh 600 depicted in FIG. 6 corresponds a portion of the right (starboard) wing assembly 102 of the model 100 of FIG. 1. As shown in FIG. 6, the mesh 600 may include an airfoil or wing mesh 602 and a nacelle mesh 606 connected to the wing mesh 602 by a pylon mesh 604. Similar to the model, each of these mesh components may form a portion of an external aeronautical surface of the airplane. Accordingly, the mesh 600 may be used to evaluate the aerodynamic performance of the respective portion of the airplane. Because the mesh 600 also represents the outer boundaries of the respective components, the mesh 600 may also be used to evaluate various constraints including, for example, volume constraints, internal envelope constraints, interference conditions, clearance conditions, and other geometric or spatial constraints. In some cases, the mesh 600 may also be used to evaluate stress due to various loading conditions, simulated deflections, acoustic conditions, or other simulated external stimuli.

As described above with respect to FIGS. 1 and 5, a script-based technique may be used to tag or label the various components and/or component geometry of the mesh 600. As discussed previously, a tag or label may be associated with a surface or other geometric element of a component, which may be referenced or used to identify geometry as a group by downstream analysis tools. In one example, the outer exposed surfaces of the mesh 600 may be assigned a particular tag identifying them as being flow-directing geometry. The tag may be used to identify geometry that is analyzed using a fluid analysis module (e.g., a computational fluid dynamics (CFD) module) to determine an aerodynamic property of the mesh 600.

As described in more detail below with respect to FIGS. 8-10C, a task list or job set may be used to define the construction of the mesh 600 and the various analytical modules or constraints that may be applied to or used to evaluate the mesh 600. The task list or job set may also specify or define how incremental or delta changes to the model are evaluated for each of multiple iterations of a design optimization or analysis. In this way, the evaluation of a large number of design alternatives or perturbations may be automatically performed.

The task list or job set may be determined or specified by an un-compiled script or instruction set, in accordance with some embodiments. As discussed previously, the script may be Python, Tcl, Perl, or another similar script-based programming language and may access a CAD kernel or other computer-implemented analysis tool using a bridge layer or compiled bridge code, as described below with respect to FIG. 11.

When performing an iterative design analysis, an initial design may be analyzed and then modified and then analyzed again to optimize the design and/or evaluate the sensitivity of the design to a particular modification. In some instances, the initial or baseline design may be referred to as a nominal computer model and an incremented, modified, or altered design may be referred to as a delta computer model. Illustrated examples of each are depicted in FIGS. 7A and 7B. Specifically, FIG. 7A depicts an example nominal computer model 700a and FIG. 7B depicts an example delta computer model 700b.

Figure 7A:
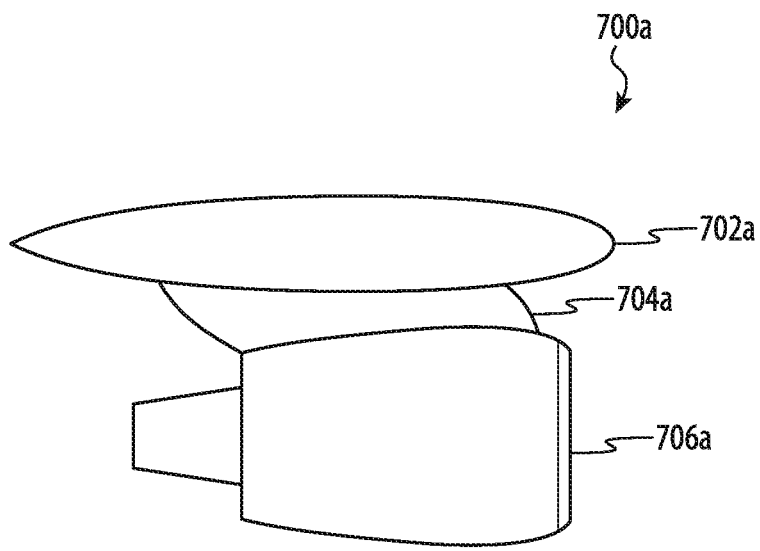
FIG. 7A depicts an example nominal computer model.

As shown in FIG. 7A, the nominal computer model 700a includes a nacelle 706a that is attached to a wing 702a by a pylon 704a. The configuration of the nominal computer model 700a may correspond to an initial or baseline configuration. While referred to as an initial or baseline configuration, the nominal computer model 700a may itself be a result of one or more previous design iterations or design optimizations and the designation as initial or baseline is merely relative to the delta computer model 700b depicted in FIG. 7B.

Figure 7B:
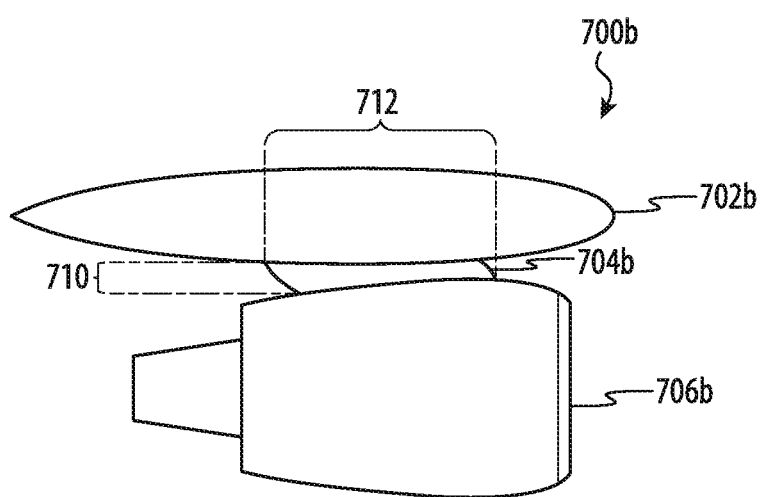
FIG. 7B depicts an example delta computer model.

As shown in FIG. 7B, a delta computer model 700b also includes a nacelle 706b that is attached to a wing 702b by a pylon 704b. However, in the delta computer model 700b, the size and shape of the pylon 704b has been modified. In this example, the delta computer model 700b has been incremented with respect to the nominal computer model 700a. Specifically, the height 710 and the length 712 of the pylon 704b have decreased by a specified increment or delta. The delta computer model 700b may correspond to one of a number of design iterations, each iteration corresponding to a different increment, delta, or permutation of the geometry of the pylon 704b.

As also shown in FIG. 7B, the modified pylon 704b results in a respective change in the spatial relationship between the wing 702b and the nacelle 706b. Specifically, a reduction in the height 710 of the pylon 704b results in a reduction in the clearance between the wing 702b and the nacelle 706b. Similarly, a reduction in the length 712 of the pylon 704b results in a change in the offset between the wing 702b and the nacelle 706b, which may also affect the clearance between the two components.

In some implementations, the delta computer model 700b is evaluated using one or more analysis tools to evaluate the performance of the design. For example, the delta computer model 700b may be converted to a mesh that includes a triangulated surface model of the geometry of the respective components. A geometric clearance analysis or clearance constraint may be performed on the mesh to determine the minimum clearance between the wing 702b and the nacelle 706b. This criteria or constraint may be evaluated with respect to a minimum clearance or target clearance or other similar criteria. Based on the evaluation with respect to this criteria, the pylon 704b may be further modified and a new or subsequent computer model may be constructed and evaluated in a similar manner. Other types of constraints may be evaluated, as discussed in more detail with respect to FIG. 8. In some cases, a series of similar delta configurations are constructed and evaluated as part of a iterative design analysis, which may be defined, at least in part, by a task list or job set. Example job sets are described below with respect to FIGS. 9A and 9B.

In some cases, the geometry of one or more components does not change between design iterations. For example, as shown in FIGS. 7A and 7B, the wing 702b of the delta computer model 700b is substantially the same as the wing 702a of the initial or nominal computer model 700a. Similarly, the nacelle 706b of the delta computer model 700b is substantially the same as the nacelle 706a of the initial or nominal computer model 700a. As described in more detail below with respect to FIG. 8, redundant or shared component geometry between different design iterations may be identified and reused for subsequent design evaluations, which may improve the computational efficiency of the iterative design analysis.

Figure 8:
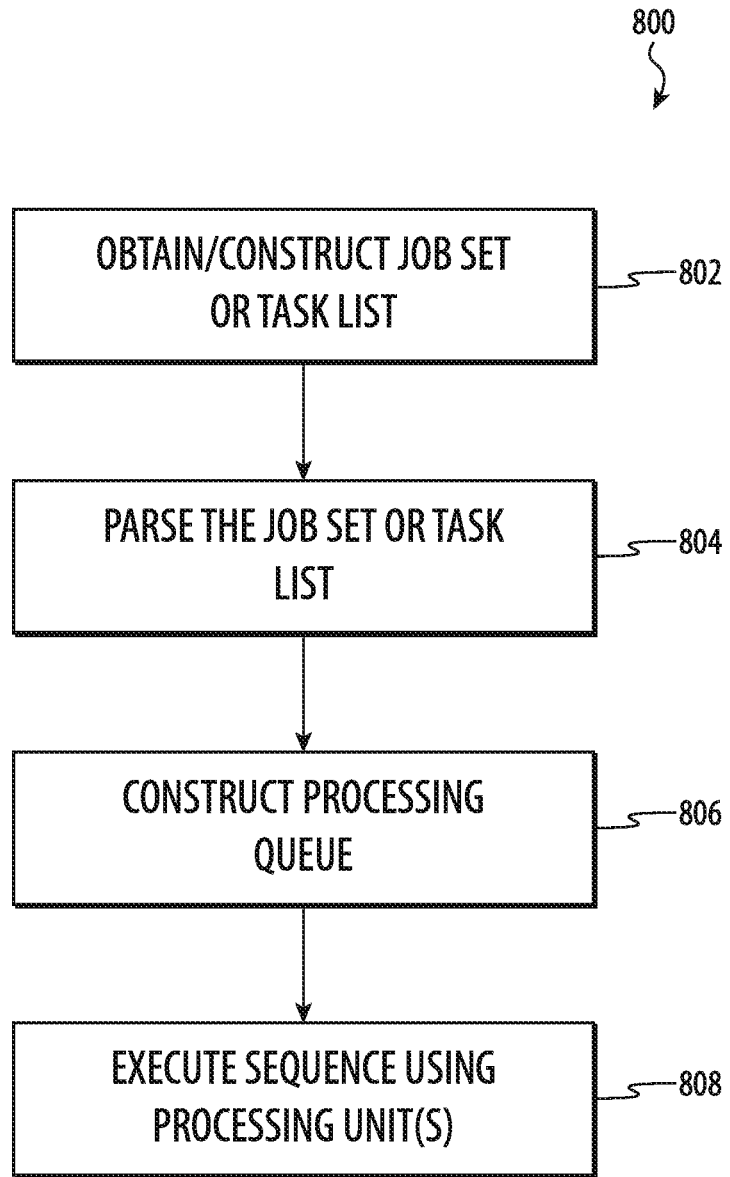
FIG. 8 depicts an example process for computing a three-dimensional model.

FIG. 8 depicts an example process for computing a three-dimensional model. In particular, FIG. 8 depicts an example process 800 that may use a task list or job set to optimize or improve the computational efficiency and/or the overall time required to construct and analyze a three-dimensional computer model. The following process is provided by way of example and is not intended to be limiting in nature. In particular, the specific operations that are performed may vary depending on the implementation. In some cases, additional operations (not depicted or described) may be performed as part of the process. In some cases, one or more of the operations described below may be omitted or skipped.

In operation 802, a job set or task list is obtained or constructed. The task list or job set may be obtained or constructed from an un-compiled script or instruction set. As discussed previously, the script may be Python, Tcl, Perl, or another similar script-based programming language that may specify the components, component geometry, assembly, component constraints within the assembly, instructions for constructing a mesh (or other geometric model), and evaluating one or more constraints. The script may be used to construct the job set and, in some cases, each instruction of the instruction set of the script corresponds to task of the task list specified by in the job set. In some cases, the job set is obtained from a previously constructed list or job set.

With respect to operation 802, the job set may include an ordered list of operations to be performed by a CAD kernel or other computer-implemented analysis tool. FIG. 9A depicts an example job set for performing a pylon optimization for a wing assembly and includes example tasks: constructing a wing assembly mesh, evaluating clearance for a nominal computer model, evaluating clearance for a delta computer model, etc. For each of these tasks, there may be multiple dependent tasks. For purposes of illustration, each dependent task is designated as having a higher level (e.g., level 1 tasks are dependent on level 2 tasks, which are dependent on level 3 tasks, and so on). The dependencies may be determined at least in part on the hierarchical configuration of the model, as described above with respect to FIGS. 1 and 5. While the example job sets demonstrate the dependencies using numerical levels, other implementations may determine dependencies using other techniques or nomenclature. While the task list or job set is displayed or depicted as having a particular order, the order does not necessarily reflect the order in which the tasks of the task list will be executed or processed.

With regard to operation 802, the task list or job set may designate one or more criteria or constraints to be evaluated for a given model. With respect to the example job set of FIG. 9A, the task list includes an evaluation of the clearance for the nominal model and an evaluation of the clearance the delta model. With respect to the example job set of FIG. 9B, the task list includes an evaluation of a spatial gradient using the nominal model and a delta model (having some modified geometry with respect to the nominal model). In other examples, a job set may include tasks that include the evaluation of an interference condition, a stress condition, a loading condition, a simulated flow condition, an acoustic condition, or other similar computer-enabled model evaluations. As shown in FIGS. 9A and 9B, the job sets 900a, 900b also define the tasks from which the evaluation or analysis depends, including, for example, the construction of the various mesh components.

Figure 9A:
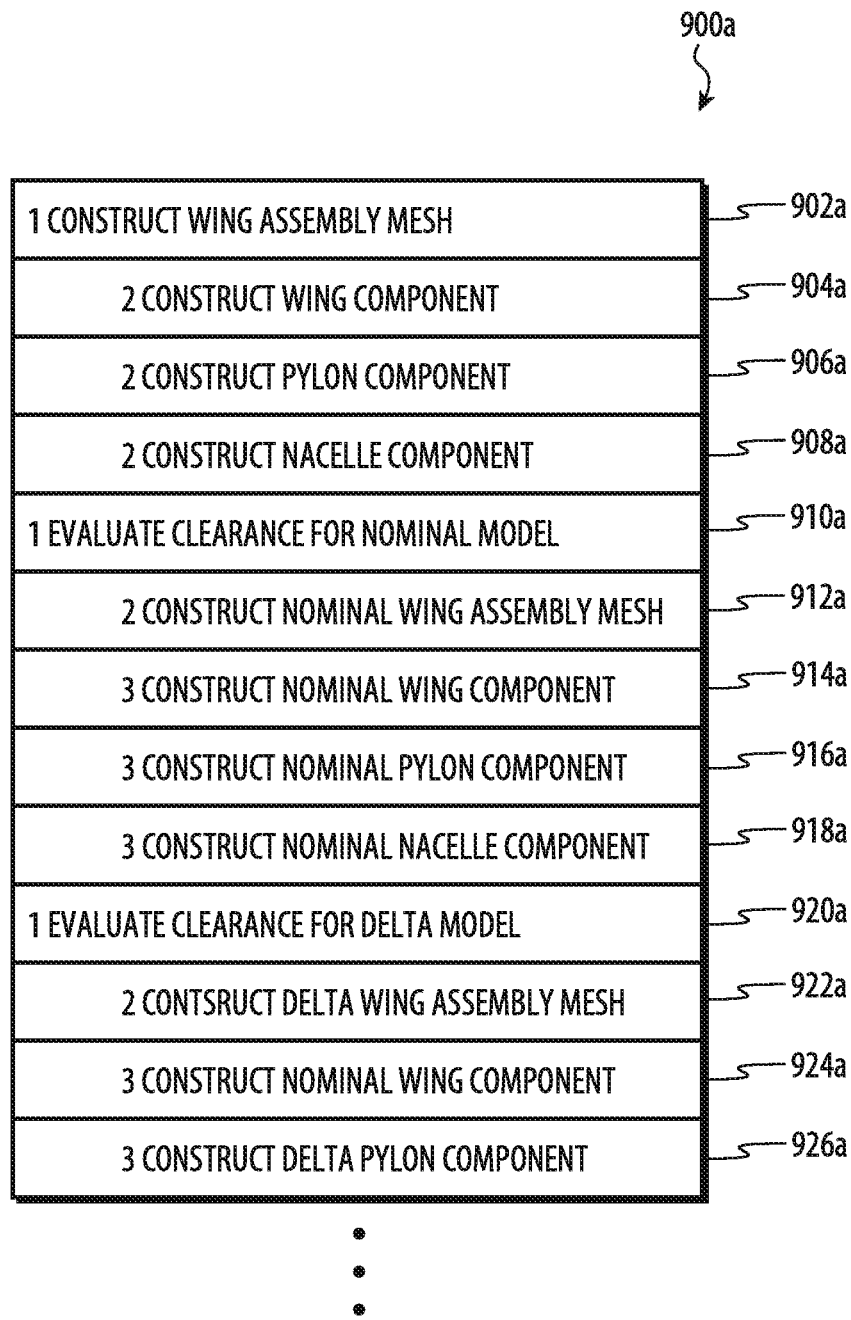
FIG. 9A depicts a first example job set.
Figure 9B:
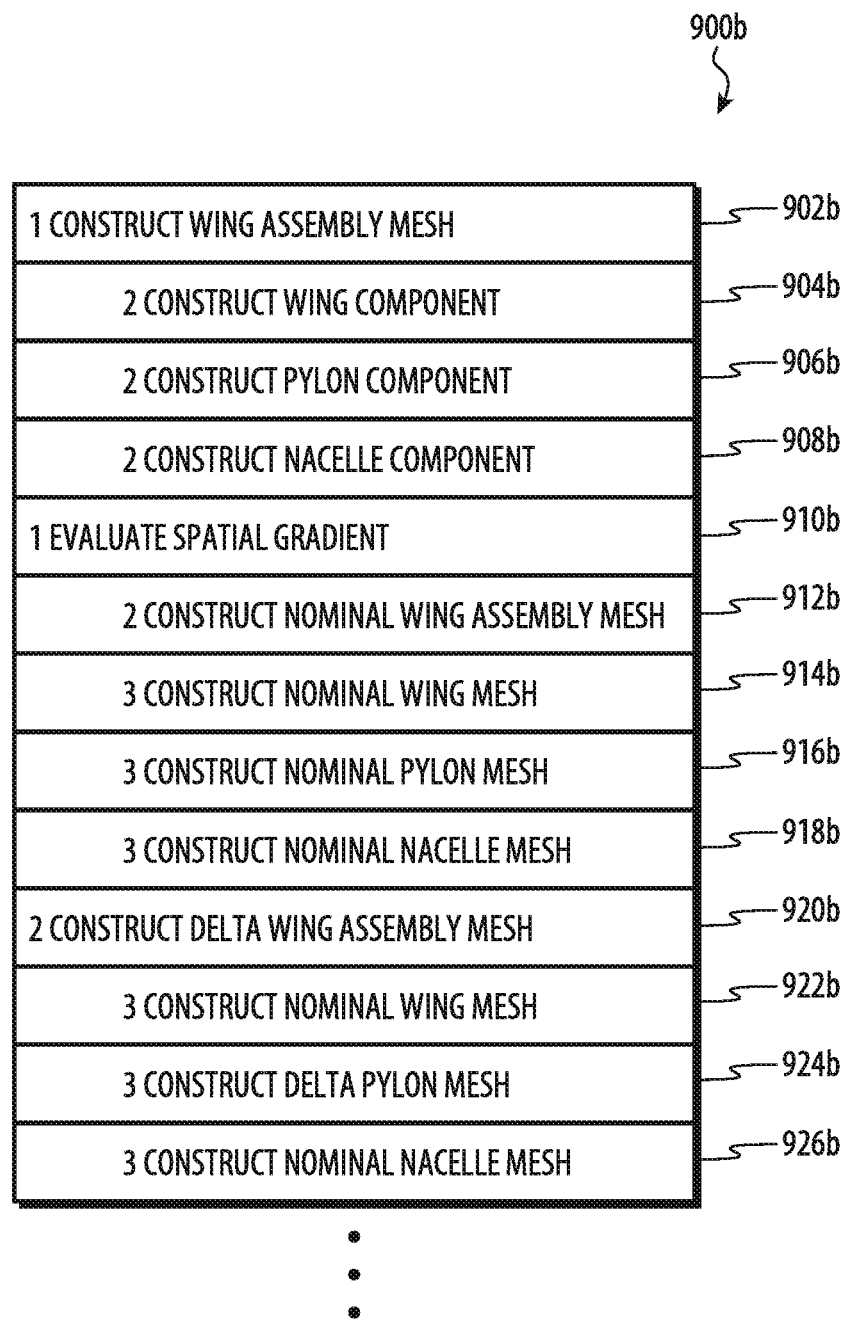
FIG. 9B depicts a second example job set.

While the examples of FIGS. 9A and 9B depict a specific type of constraint to be analyzed, a variety of different constraints may be implemented using the process 800. In some instances, a constraint may represent an evaluation of a component, component geometry, and/or assembly that produces a scalar value or result. The output of a constraint analysis may indicate compliance with a condition (represented by, for example, a positive scalar value) or violation of a specific condition. (represented by, for example, a negative value). The magnitude of the scalar value may signify the degree or extent of the compliance or violation. Downstream optimization frameworks may use the results of constraint evaluation, as well as the sensitivity of the constraint value with respect to one or more variables, to ensure that the final geometry satisfies a criteria evaluated using the constraint.

In some implementations, constraints may fall into one of a number of categories, including, without limitation: volume constraints; accessory constraints; thickness constraints; and custom constraints. An example volume constraint may specify a solid body component or assembly, and a bounding box or a second solid body. The volume constraint may report the volume of the intersection of the two. An example protrusion or accessory constraint may specify a solid body accessory or component, which represents an object which should fit completely inside another solid body component or assembly. If the accessory exists completely within the component or assembly, the constraint may compute the clearance (the shortest distance between the accessory surface and the component/assembly surface), in which case the constraint is satisfied. If the accessory or internal component protrudes from the other component/assembly, then the constraint is violated and the constraint may return a negative value, which may be the negative of the cube root of the volume of the protrusion.

A thickness constraint may specify a solid body component or assembly, such as a wing or wing strake assembly, and a set of data points. The thickness constraint may evaluate the thickness of the body across the data points. The thickness constraint may be defined by a number of constraint points along the given body. Each point of the constraint points list contains coordinates (x, y, z coordinates) as well as a thickness value that represents the minimum allowable thickness of the body at that point. The thickness may be evaluated in the direction described by a common thickness direction vector for all points, or a thickness direction vector at each point.

An example thickness constraint may interpolate a number of data points that are arranged between a first and last point in the list. In some cases, the data points are evenly spaced along the body using an interpolation routine. The data points may be used to define a poly-line through 3D space. The thickness constraint may evaluate the thickness of the given body at each of the points along the poly-line and compare the evaluated thickness with the constraint or minimum thickness value. If the evaluated thickness is greater than or equal to the constraint or minimum thickness at each point, then the constraint is satisfied and the minimum difference between evaluated thickness and constraint thickness may be returned. Otherwise, the negative of the square root of a total area between the evaluated thickness curve and the constraint thickness curve in the regions where the constraint is violated may be returned.

The user or script writer may also develop or specify a custom constraint. In some implementations, a user may specify a function-type constraint, which evaluates a component or assembly with respect to a data dictionary and returns a scalar value and other optional information. In one example, the script writer may define a Python function having a solid body entity and a data dictionary as arguments and returns a dictionary containing the scalar value of the constraint evaluation and other optional information. In some implementations, a user may specify a component-build-function constraint, which constructs or builds a component and returns a custom constraint evaluation in a dictionary, which may include a scalar value and other optional information. An object or module of the system may automatically report any constraint results returned and may also be able to calculate the sensitivities for each of these constraints for each perturbation requested.

With regard to operation 802, the task list or job set may also define one or more modified or delta models. As described above with respect to FIG. 7B, a delta computer model may be defined as having one or more components that are modified or have an incremented dimension with respect to a baseline or a nominal computer model. For example, the delta model may have one or more components that have a modified geometry that deviates from a nominal geometry in one or more aspects. In some implementations, the delta computer model has a modified material property, surface finish, constraint condition, or other aspect that may affect the results of the analysis. The task list or job set may be used to specify what aspect of the model is to be modified and how much it is to be modified. In some implementations, the job set defines a series or set of modifications to define a series or set of delta models, which may be used to evaluate a set of design alternatives or optimize a particular aspect of the design.

In operation 804, the job set or task list is parsed. In particular, the job set may be evaluated to identify shared or common tasks within the task list. For example, for a series of calculations, the construction of a solid model for a particular component and/or the construction of a mesh for a particular component may occur multiple times within the job set or task list. With reference to the job set 900a of FIG. 9A, the tasks 912a and 924a are both directed to constructing a mesh for a nominal wing component. While each task 912a and 924a are dependent tasks for different tasks (e.g., 910a and 920a, respectively), the computation involved for the tasks 912a and 924a may be substantially the same. Accordingly, groups of shared, common, or redundant tasks may be identified and classified as part of operation 804.

In operation 806, a processing queue is constructed. In particular, a group of tasks to be processed may be generated based on the job set and the parsing performed in operation 804. In some examples, common or shared tasks that are identified as part of operation 804 are prioritized or elevated within the group with respect to other tasks or items in the group. For example, prioritizing a subset of common or shared tasks may involve increasing the priority or modifying the order of the tasks so that they come earlier in the processing queue.

In some instances, the prioritization places the common or shared tasks near or at the top of a list order so that they are performed first or early in the processing sequence. However, in some instances, the prioritization merely elevates the common or shared tasks with respect to their respective positions within the job set, but does not necessarily place them first or at the top of the list order. Stated another way, subtasks that are needed for multiple main tasks may be placed higher in the list order than those main tasks.

By grouping and prioritizing common or shared tasks, the overall computing time may be reduced. For example, multiple redundant tasks that would ordinarily be performed multiple times over the course of an analysis may be performed one time and the results saved or otherwise stored in computer memory. The precomputed tasks, which may be dependent tasks for other tasks in the list, may be recalled from computer memory or storage and used without having to repeat the computation. For example, solid computer models, surface models, meshes, and other geometric representations for nominal components may be prioritized over other tasks in the list and the results of these computations or constructions may be saved for later use when performing other tasks, including analysis of surface mesh models that include one or more nominal meshes. Prioritization and reuse of common or shared tasks reduces the computing resources required for a particular analysis and, in some cases, may also reduce the computing time.

With regard to operation 806, the task list may be evaluated or parsed to identify two or more groups of tasks that may be executed or computed independent of each other. For example with respect to the job set 900a of FIG. 9A, the computation of the various nominal models and nominal meshes (e.g., tasks 902a, 904a, 907a, 908a, 912a, 914a, 916a, and 918a) may be computed or executed independent of other tasks that are directed to the computation of one or more of the delta meshes (e.g., task 922a). Independent groups of tasks may be identified using the hierarchical configuration set out in the model assembly, the job set, or other representations of the model and/or the analysis to be performed. In some cases, independent groups of tasks are identified by identifying main tasks that do not share subtasks that require computation. Note that two groups of tasks may share subtasks, but if those subtasks are prioritized, precomputed, and stored, the two groups of tasks may be effectively independent since they may both leverage the precomputed and stored subtasks. Thus, identifying shared or common tasks (e.g., shared subtasks) in accordance with operation 804 may help reduce the dependencies between main tasks.

In general, the more independent groups of tasks that are identified, the more the processing efficiency may be improved. More specifically, independent groups of tasks may be assigned to distinct processing units and may be executed in parallel, which may reduce the overall computing time required to analyze a design.

Figure 10A:
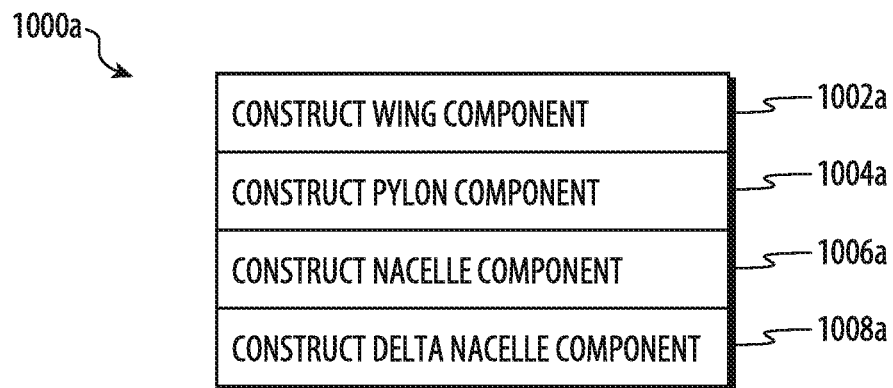
FIGS. 10A-10C depict example process queues that correspond to the first example job set of FIG. 9A.
Figure 10B:
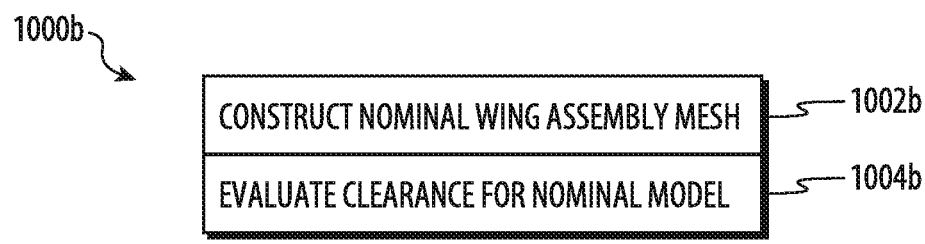
Figure 10C:
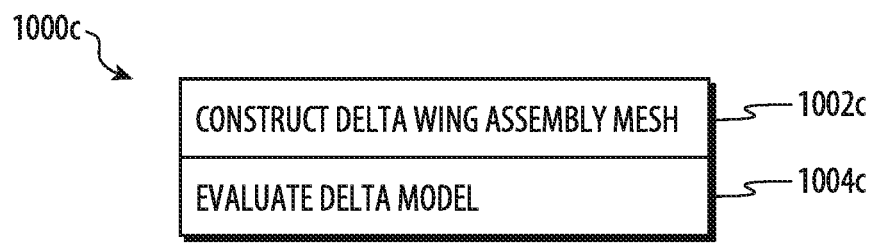

In operation 808, the sequence of tasks in the processing queue may be executed using one or more processing units. In some instances, different groups of independent tasks identified in accordance with operation 806 may be assigned and executed on separate and distinct processing units, in parallel. FIGS. 10A-10C depict example sequences that may each be performed on separate processing units. These tasks may correspond to the processing queue(s) generated in operation 806 and may be based on a job set similar to the example provided in FIG. 9A.

With regard to operation 808, the separate or distinct processing units may correspond to separate computer processors, separate computer processors implemented within separate computer systems, and/or separate processing threads operating on the same processor or multiple processors. In general, in order to achieve an improvement in computing efficiency, the processing units may be configured to execute the tasks in parallel or during an overlapping period of time.

FIGS. 9A and 9B depict example job sets in accordance with the embodiments described herein. As shown in FIG.

9A, the job set 900a includes a list of main tasks and subtasks from which the main tasks depend. In the specific example of FIG. 9A, the main tasks are generally designated as having a level that is lower in numerical value than the subtasks from which it depends. This is somewhat arbitrary and the dependencies or hierarchy of the various tasks may be represented using a different nomenclature, different designation, or other technique for designating the appropriate relationships between the various tasks. By way of example, the job set may be represented by a series of data structures that are related in a way that designates the hierarchy depicted in the job set 900a.

As shown in FIG. 9A, the job set 900a includes a portion of a task list for analyzing a clearance condition between a wing and a nacelle when a pylon connecting the two is modified. The example job set 900a may correspond to an analysis that is performed on the nominal and delta models depicted in FIGS. 7A and 7B. By way of example, the job set 900a may include main task 902a, which is directed to constructing a wing assembly mesh. The job set also includes main tasks 910a and 920a, which are directed to evaluating clearance conditions for a nominal model and a delta model, respectively.

As shown in FIG. 9A, the main tasks are dependent on a number of subtasks. The subtasks include tasks 904a, 906a, 908a directed to construction of the various components of the wing assembly. Tasks 904a, 906a, 908a may involve the construction of a surface model, a solid model, or some other three-dimensional model or geometric representation. As discussed above, these tasks may be performed using a computer-aided design (CAD) kernel or other similar type of CAD engine. Other subtasks 912a and 922a are directed to the construction of a nominal and delta wing assembly mesh, respectively. The subtasks 912a and 922a are dependent on further subtasks 914a, 916a, 918a, 922a, 924a, and 926a, each directed to the construction of a mesh of a respective component. As described previously, the construction of a mesh may include constructing a series of discrete geometric elements (e.g., surface triangles, surface points, solid elements, voxels) that can be used to perform some analysis or simulation.

As shown in FIG. 9A, there are some main tasks that share one or more subtasks. In particular, main tasks 910a and 920a share subtasks 912a and 922a. These shared or common tasks may be identified and prioritized in a processing queue in accordance with the process 800, described above with respect to FIG. 8. By prioritizing, precomputing, and storing the various shared subtasks, the analysis may be performed in a more efficient manner. Furthermore, precomputing shared subtasks may reduce dependencies between main tasks, which may enable further parallel processing and further improve the computational efficiency of the analysis.

FIG. 9B depicts a second or alternative job set 900b. The job set 900b may be used to compute a spatial gradient constraint between a nominal and a delta model. The spatial gradient may represent the amount or degree of change in a geometric shape over the surface of a part and may be used to help determine the effect of a particular parameter or dimension on the geometry of the component. The spatial gradient may also be used to determine an optimal shape of a component for a particular application or condition.

Similar to the previous example, the job set 900b includes multiple main tasks 902b, 910b, and 920b. Each of these main tasks is dependent on a respective group of subtasks. For example, main task 902b is dependent on subtasks 904b, 906b, and 908b; main task 910b is dependent on subtasks 912b, 914b, 916b, and 918b; and main task 920b is dependent on subtasks 922b, 924b, and 926b. Also, similar to the previous example, two or more main tasks (e.g., 910b and 920b) share one or more subtasks (e.g., 912b and 922b). As discussed above, shared or common tasks may be prioritized, precomputed, and the results stored to improve the computational efficiency of the analysis.

FIGS. 10A-10C depict groups of tasks associated with processing queues 1000a, 1000b, and 1000c in accordance with the embodiments described herein. The processing queues 1000a, 1000b, and 1000c may correspond to groups of independent tasks associated with the job set 900a described above with respect to FIG. 9A. In general, the execution or computation of the various tasks for each of the processing queues may be performed independent of each other. In some cases, two or more groups of tasks may be performed in parallel but are dependent on a third group of tasks that is performed in advance. Here, processing queues 1000b and 1000c can be performed in parallel while they may both be dependent on processing queue 1000a. Thus, processing queues 1000b and 1000c may be performed on separate or distinct processing units in parallel and/or on separate and distinct threads on a multi-threaded processor. In particular, the tasks 1002b, 1004b associated with the processing queue 1000b may be computed or performed over a period of time that overlaps with the computation or performance of the tasks 1002c, 1004c associated with processing queue 1000c. The tasks 1002a, 1004a, 1006a, and 1008a associated with the processing queue 1000a may be computed or performed in advance of the processing queues 1000b, 1000c on a separate or the same processing unit.

As described above, grouping independent tasks and performing or computing at least some of the tasks in parallel using separate or distinct processing units (or a multi-threaded processor) may enhance or improve the computational efficiency of the analysis. Furthermore, the results of one or more of the computed tasks may be stored for later use by one or more subsequent tasks or processing queues, which may further improve the computational efficiency.

Figure 11:
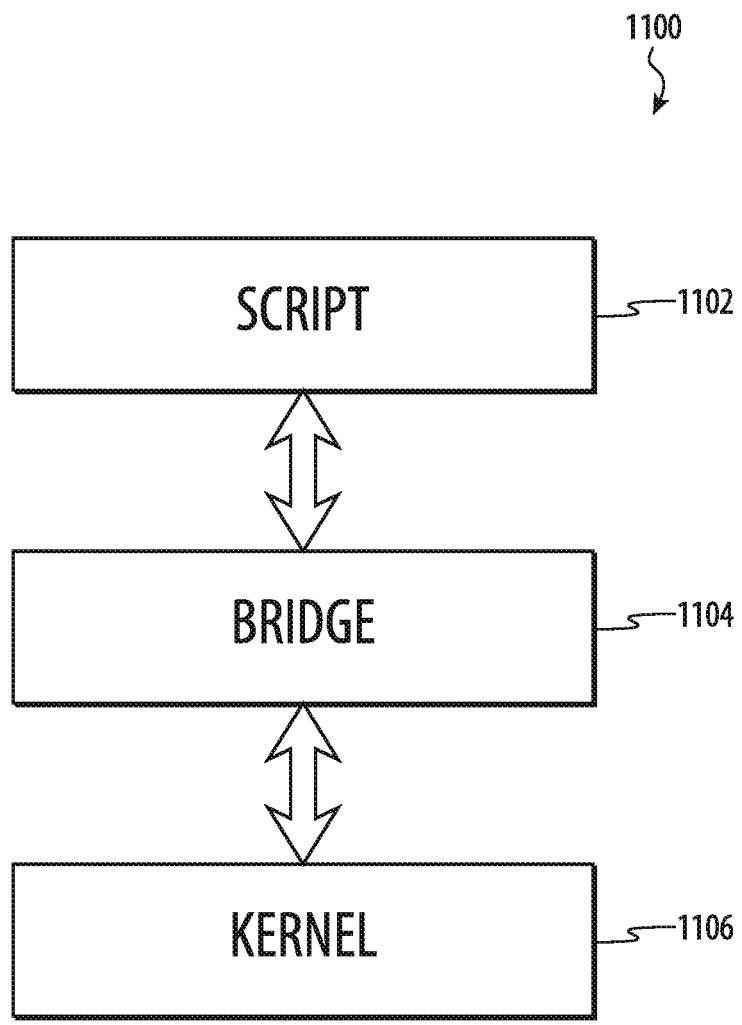
FIG. 11 depicts a schematic diagram of a script-based system for generating or analyzing a three-dimensional model.

FIG. 11 depicts an example architecture for a script-based implementation. In particular, the system 1100 may include a script 1102 which communicates with a kernel 1106 through a bridge layer 1104, which may include one or more layers of software objects and/or wrappers that are configured to provide access to properties or parameters of kernel objects or elements. The system 1100, as described herein, may be used to improve the utilization of computer processing and memory resources in order to facilitate more rapid design optimization and exploration.

The script 1102 may include un-compiled, runtime compiled, or runtime implemented instructions that are drafted by the end user performing the design analysis. The script 1102 is designed to be an intuitive interface that, through the bridge layer 1104, may provide access to powerful functionality available in the CAD kernel 1106. The script 1102 may also be used to provide access to other computer-implemented modeling tools or analysis modules like computer fluid dynamic (CFD) modules, finite-element analysis (FEA) modules, thermal analysis modules, and the like. Example computer-implemented modeling tools or computer-implemented analysis modules include, without limitation, Cart3D, ANSYS CFD, ANSYS FEA, Nastran, and other similar commercially available analysis tools. Thus, the script 1102 may be used to direct computer-aided analysis across multiple platforms in automated manner. In some cases, modeling and analysis performed or instructed by the script 1102 may be synthesized without interfacing with a traditional graphical user interface (e.g., a menu-driven interface with a 3D CAD visualization window), which may save computing resources and design time. In some implementations, the script 1102 is implemented with a graphical user interface or visualization component.

In accordance with the embodiments described herein, the script 1102 may include instructions for creating and/or manipulating component geometry, implementing smart objects, tagging or labeling components, calling for the evaluation of constraints, instructing other computer-implemented analysis, and other tasks. The script 1102 may be implemented in a scripting programming language, such as Python, Perl, or Tcl. Using the script 1102, an end user can construct a modeling and analysis routine that is targeted to a particular solution or evaluation without having to engage in traditional CAD modeling activities or use a traditional CAD graphical user interface. As described herein, the script 1102 may enable multiple design iterations to be performed in an efficient manner by allowing the end user to specify a sequence of complex analyses without having to recreate repeated steps or groups of operations. The use of scripts may also enable task prioritization and parallel processing, which may increase the computing efficiency of the CAD computing system.

As shown in FIG. 11, the system 1100 may include a bridge layer 1104, which includes compiled code that enables the script 1102 to manipulate and instruct the CAD kernel 1106. The bridge layer 1104 may also be referred to as compiled bridge code or an intermediate software interlink. In general, the bridge layer 1104 includes multiple layers that form the interface between the script 1102 and the CAD kernel 1106. The compiled modules of the bridge layer 1104 may function as wrappers for the CAD kernel 1106 and enable communication of data, parameters, and other information between the script and the CAD kernel 1106 and back. In some cases, the bridge layer 1104 is also configured to reconcile differences in object pointers and other data objects that may exist between the CAD kernel 1106 and the script 1102. The bridge layer 1104 may be configured to curate or provide special handles to the CAD kernel 1106, which may simplify the interaction with the underlying CAD kernel 1106 while also providing powerful functionality.

In some implementations, the bridge layer 1104 includes one or more compiled C++ modules that may include a Boost C++ library and Boost-Python connection functions. The C++ modules may connect lower level C++ APIs to one or more layers of intermediate C++ and Python or script-based language function definitions. In one specific example, the bridge layer 1104 includes a first layer of objects that function as wrappers for the advanced programming interface (API) of the CAD kernel 1106. The first layer of the bridge layer 1104 includes objects that adapt the kernel data hierarchy for a custom bridge hierarchy and implements a shared pointer scheme instead of the simple pointers of the CAD kernel 1106. A second layer of the bridge layer 1104 may include custom C++ code that implements some of the functionality described above with respect to specific examples. For example, the second layer of the bridge layer 1104 may include smart objects that are adapted to interpret selected properties presented to the user through the script 1102 to implement geometry-creating functionality in the CAD kernel 1106. Other custom C++ code may include implementations of curve-fitting or tangent end condition algorithms that supplement or synthesize functionality not available or native in the CAD kernel 1106. A third layer of the bridge layer 1104 may include a combination of Boost C++ library and Boost-Python connection functions that interface directly with the script 1102. The third layer may, for example, adapt the syntax of various function calls to improve the readability or usability of native kernel functions, as described above with respect to the Boolean equation-style function calls. The third layer, through the use of shared pointers, provide access to parameters and properties that are used by lower layers of the bridge 1104 and/or the CAD kernel 1106.

The bridge layer 1104 may also be used to access other non-CAD kernel software or modules. For example, the bridge layer 1104 may be used to access or implement other computer-implemented modeling tools or analysis modules like computer fluid dynamic (CFD) modules, finite-element analysis (FEA) modules, thermal analysis modules, and the like. As discussed above, example computer-implemented modeling tools or computer-implemented analysis modules include, without limitation, Cart3D, ANSYS CFD, ANSYS FEA, Nastran, and other similar commercially available analysis tools. In some implementations, the computer-implemented modeling tools or computer-implemented analysis modules include code for computing one or more constraints in accordance with the embodiments described herein. In particular, the computer-implemented modeling tools or computer-implemented analysis modules may include code for computing a volume-type constraint, a protrusion-type constraint, a thickness-type constraint, and so on.

In general, the CAD kernel 1106 includes compiled software that can be used to create three-dimensional model geometry. The three-dimensional model geometry may include boundary representations, surface models, solid models, and other computer-generated geometry representations. The three-dimensional model geometry may be defined using parametric constraints or other techniques for specifying the spatial relationships between elements. Example kernels include ACIS, Parasolid, CGM, Granite, OpenCASCADE, and other similar modeling kernels. Typically, a CAD kernel includes object-oriented software and/or advanced programming interfaces (APIs) that may be accessed by the script 1102 through the bridge layer 1104.

The system 1100 may use the script 1102 to access the CAD kernel 1106 to facilitate task prioritization and parallel processing when performing a design analysis, as described above with respect to FIGS. 8-10C. The system 1100 may also be particularly well suited for performing iterative design analyses in which several iterations of component geometry are created and evaluated using one or more constraints. The system 1100 may also be particularly well suited for modeling and analysis using a computer-implemented design analysis tool, as described above.

Figure 12:
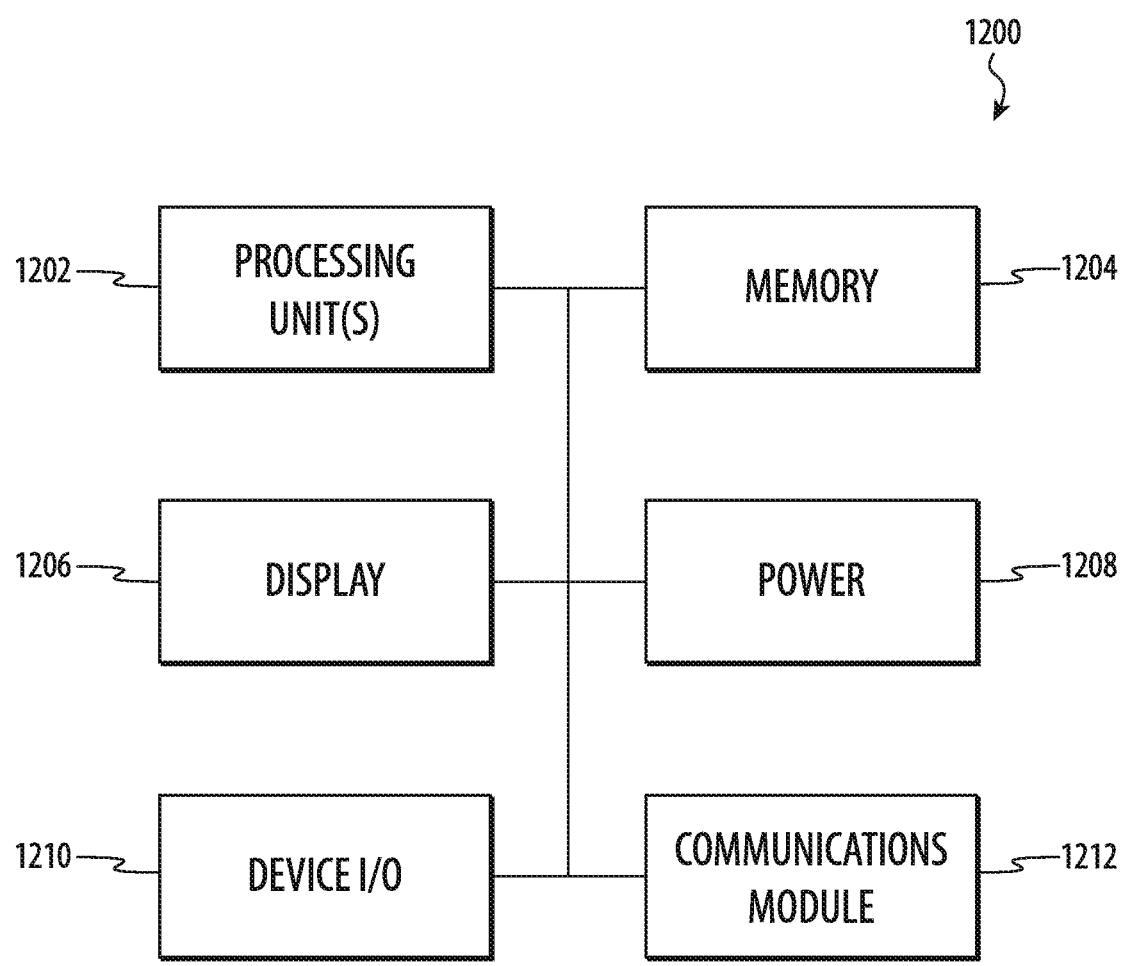
FIG. 12 depicts an example computing system.

FIG. 12 depicts an example schematic diagram of a computing system 1200. The computing system 1200 may be used to implement or embody any of the computer-implemented methods, processes, or techniques described herein. In particular, the computing system 1200 may define a computer-aided design (CAD) workstation or server that is specially configured to construct and analyze three-dimensional computer models. The computing system 1200 may be used to implement system 1100 described above with respect to FIG. 11. The computing system 1200 may also be used to perform any of the computer-implemented methods including, for example the process 800 described above with respect to FIG. 8. In some instances, the computing system 1200 is a desktop computer or includes a desktop terminal that is configured for use by a CAD operator, designer, or engineer.

To the extent that multiple functionalities, operations, and structures are disclosed as being part of, incorporated into, or performed by the computing system 1200, it should be understood that various embodiments may omit any or all such described functionalities, operations, and structures. Thus, different embodiments of the computing system 1200 may have some, none, or all of the various capabilities, apparatuses, physical features, modes, and operating parameters discussed herein.

As shown in FIG. 12, the computing system 1200 includes one or more processing unit(s) 1202 that are configured to access a memory 1204 having instructions or computer programs stored thereon. The instructions or computer programs may be configured to perform one or more of the operations or functions described with respect to the computing system 1200. For example, the instructions may be configured to construct and/or analyze three-dimensional computer models and cause the computer models to be displayed on a display 1206. The processing unit(s) 1202 and memory 1204 may also be used to coordinate signals and/or data that is used to operate the device I/O 1210, the communications module 1212, or other components or subsystems of the computing system 1200.

The processing unit(s) 1202 of FIG. 12 may be implemented as any electronic component or subsystem that is capable of processing, receiving, or transmitting data or instructions. For example, the processing unit(s) 1202 may include one or more of: a microprocessor, a central processing unit (CPU), an application-specific integrated circuit (ASIC), a digital signal processor (DSP), or combinations of such devices. In some implementations, the processing unit(s) 1202 include a graphical processing unit (GPU) having an architecture that is specially configured for performing complex graphical computations and/or graphical renderings. The processing unit(s) 1202 may include one or more multi-threaded processors that are configured to execute multiple process threads or tasks in parallel. As described herein, the term "processor" is meant to encompass a single processor or processing unit, multiple processors, multiple processing units, or any other suitably configured computing element or elements.

The memory 1204 can store data and/or instructions that can be used by the computing system 1200. For example, a memory can store data or content including, for example, computer code, script files, executable computer programs, program parameters or settings, audio and/or video files, documents, CAD files, device settings and user preferences, data structures or databases, and so on. The memory 1204 can be configured as any type of memory. By way of example only, the memory can be implemented as random access memory, read-only memory, Flash memory, removable memory, remote or cloud-based memory, or other types of storage elements, or combinations of such devices.

The computing system 1200 also includes display 1206 that is operably coupled to the processing unit(s) 1202 and memory 1204. The display 1206 may include an external monitor or display unit that is configured to display or depict a graphical output including, without limitation, a graphical user interface, three-dimensional computer objects, rendered surface models, rendered solid models, and other graphical elements. The display 1206 may include a liquid-crystal display (LCD), cathode ray tube (CRT), organic light-emitting display (OLED), or other display element or device.

The computing system 1200 also includes device I/O 1210, which may be configured to send and/or receive input to or from a user. The device I/O 1210 may include a keyboard, number pad, trackpad, touch screen, or other input device that is configured to receive input from a user. The device I/O 1210 may also include one or more speakers, visual indicators, or other device that is configured to provide an output to the user. In some cases, the device I/O 1210 includes a microphone, camera, or other sensor, that is configured to receive audio, optical, or other form of input. The device I/O 1210 may be physically integrated with the computing system 1200 or may be operably coupled through a wired or wireless interface. In some cases, the device I/O 1210 is operably coupled with the other components of the computing system 1200 through the communications module 1212.

The one or more communications modules 1212 may include one or more wireless interface(s) that are adapted to provide communication between the processing unit(s) 1202 and an external device. In general, the one or more communications modules 1212 may be configured to transmit and receive data and/or signals that may be interpreted by instructions executed on the processing unit(s) 1202. In some cases, the external device is part of an external communication network that is configured to exchange data using a wired and/or wireless interface. Generally, a wired interface may include an network interface card (NIC) or other network interface circuitry that may define an Ethernet interface or other hard-wired network interface. In some instances, the wired interface includes, without limitation, a USB interface, TCP/IP interface, or other standardized wired interface. Generally, the wireless interface may include, without limitation, radio frequency, optical, acoustic, and/or magnetic signals and may be configured to operate over a wireless interface or protocol. Example wireless interfaces include radio frequency cellular interfaces, fiber optic interfaces, acoustic interfaces, Bluetooth interfaces, infrared interfaces, Wi-Fi interfaces, or other wireless network communications interfaces.

As shown in FIG. 12, the computing system 1200 may include a power source 1208 that is used to provide power to the other components of the computing system 1200. In some instances, the power source 1208 is an internal battery that is configured to store and provide power to the other components of the computing system 1200. For example, the power source 1208 may be a rechargeable power supply that is configured to provide power to the computing system 1200 while it is being used by the user. In some instances, the power source 1208 is an internal power supply that is configured to receive power from an external source such as an outlet or external power supply.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. Many modifications and variations are possible in view of the above teachings.

Moreover, the foregoing figures and descriptions include numerous concepts and features, which may be combined in numerous ways to achieve numerous benefits and advantages. Thus, features, components, elements, and/or concepts from various different figures may be combined to produce embodiments or implementations that are not necessarily shown or described together in the present description. Further, not all features, components, elements, and/or concepts shown in a particular figure or description are necessarily required in any particular embodiment and/or implementation. It will be understood that such embodiments and/or implementations fall within the scope of this description.

What is claimed is:

1. A computer-implemented method for analyzing a three-dimensional computer model, the method comprising:
   obtaining an un-compiled script including:
      a first set of instructions for creating a solid model component of the three-dimensional computer model;
      a second set of instructions for positioning the solid model component with respect to a reference within the three-dimensional computer model; and
      a third set of instructions for performing an analysis of the three-dimensional computer model;
   generating the solid model component in accordance with the first set of instructions by implementing a computer-aided design (CAD) kernel accessed using compiled bridge code;
   positioning the solid model component within the three-dimensional computer model in accordance with the second set of instructions;
   analyzing the three-dimensional computer model using a computer-implemented analysis module in accordance with the third set of instructions; and
   causing display of a result of the analysis performed using the computer-implemented analysis module.

2. The computer-implemented method of claim 1, wherein:
   the first set of instructions includes:
      instructions for generating a base object of the solid model component by implementing the CAD kernel accessed using the compiled bridge code; and
      instructions for adding a feature to the base object of the solid model component by implementing the CAD kernel accessed using the compiled bridge code.

3. The computer-implemented method of claim 1, wherein:
   the first set of instructions includes:
      instructions for generating a first three-dimensional object by implementing the CAD kernel accessed using the compiled bridge code;
      instructions for generating a second three-dimensional object by implementing the CAD kernel accessed using the compiled bridge code; and
      instructions for merging the first and second three-dimensional objects using an equation-based instruction format to create the solid model component.

4. The computer-implemented method of claim 1, wherein:
   the first set of instructions includes:
      instructions for generating a first three-dimensional object corresponding to the solid model component;
      instructions for generating a second three-dimensional object corresponding to a second solid model component of the three-dimensional computer model;
      instructions for assigning a first tag to a first surface of the first three-dimensional object; and
      instructions for assigning a second tag to the first three-dimensional object while maintaining the assignment of the first tag to the first surface.

5. The computer-implemented method of claim 4, wherein:
   the computer-implemented analysis module identifies the first surface using the first tag; and
   the computer-implemented analysis module performs the analysis using the first surface.

6. The computer-implemented method of claim 1, wherein:
   the computer-implemented analysis module computes one or more of:
      a volume-type constraint;
      a protrusion-type constraint; or
      a thickness-type constraint.

7. The computer-implemented method of claim 1, wherein:
   the CAD kernel is a Parasolid kernel; and
   the computer-implemented analysis module is a computational fluid dynamic (CFD) module.

8. The computer-implemented method of claim 1, wherein the compiled bridge code includes a first layer of software objects that operates as a wrapper for an advanced programming interface of the CAD kernel.

9. A computer-implemented method for analyzing a three-dimensional computer model, the method comprising:
   obtaining a runtime script including:
      a first set of instructions for creating a surface model component of the three-dimensional computer model;
      a second set of instructions for positioning the surface model component within the three-dimensional computer model; and
      a third set of instructions for performing an analysis of the three-dimensional computer model;
   generating the surface model component in accordance with the first set of instructions by implementing a computer-aided design (CAD) kernel accessed using a compiled bridge code;
   positioning the surface model component within the three-dimensional computer model in accordance with the second set of instructions;
   analyzing the three-dimensional computer model using a computer-implemented analysis module in accordance with the third set of instructions; and
   causing display of a result of the analysis performed using the computer-implemented analysis module.

10. The computer-implemented method of claim 9, wherein:
    the first set of instructions include:
       instructions for generating a base object of the surface model component by implementing the CAD kernel accessed using the compiled bridge code; and
       instructions for adding a feature to the base object of the surface model component by implementing the CAD kernel accessed using the compiled bridge code.

11. The computer-implemented method of claim 9, wherein:
    the first set of instructions includes:
       instructions for generating a first three-dimensional object corresponding to the surface model component;
       instructions for generating a second three-dimensional object corresponding to a second surface model component of the three-dimensional computer model;
       instructions for assigning a first tag to a first surface of the first three-dimensional object; and instructions for assigning a second tag to the first three-dimensional object while maintaining the assignment of the first tag to the first surface.

12. The computer-implemented method of claim 11, wherein:
the computer-implemented analysis module identifies the first surface using the first tag; and
the computer-implemented analysis module performs the computer-implemented analysis using the first surface.

13. The computer-implemented method of claim 9, wherein:
the computer-implemented analysis module computes one or more of:
a volume-type constraint;
a protrusion-type constraint; or
a thickness-type constraint.

14. The computer-implemented method of claim 9, wherein:
the CAD kernel is an ACIS-based kernel; and
the computer-implemented analysis module is a computational fluid dynamic (CFD) module.

15. The computer-implemented method of claim 9, wherein the compiled bridge code includes a first layer of software objects that operates as a wrapper for an advanced programming interface of the CAD kernel.

16. A computer-implemented method for analyzing a computer model of an assembly, the method comprising:
obtaining an un-compiled script having a set of instructions for analyzing the computer model of the assembly;
creating a job set including a group of tasks specified by the set of instructions, the group of tasks including tasks for:
constructing a nominal solid model for each component of the computer model by implementing a computer-aided design (CAD) kernel using a compiled bridge layer;
constructing a nominal mesh of discrete elements for each nominal solid model;
constructing a delta solid model for at least one component of the set of components, the delta solid model having at least one parameter that is incrementally varied with respect to the nominal solid model;
constructing a delta mesh of discrete elements for the delta solid model and at least one nominal solid model; and
performing an analysis using at least one of the nominal mesh or the delta mesh;
identifying a subset of common tasks within the group of tasks;
generating a task order by prioritizing the subset of common tasks with respect to other tasks of the group of tasks;
constructing a processing queue based on the task order; and
executing tasks of the processing queue on a processing unit in accordance with the task order.

17. The computer-implemented method of claim 16, wherein the subset of common tasks includes:
constructing a first nominal solid model corresponding to a first component of the computer model; and
constructing a second nominal solid model corresponding to a second component of the computer model.

18. The computer-implemented method of claim 16, further comprising:
identifying a first group of tasks within the processing queue that can be executed independent of a second group of tasks within the processing queue;
executing the first group of tasks on the processing unit; and
executing the second group of tasks on another processing unit that is distinct from the processing unit.

19. A computer-implemented method for analyzing a three-dimensional computer model, the method comprising:
obtaining an un-compiled script having a set of instructions in a text format;
creating a job set in a processing queue including tasks that are specified by the set of instructions of the un-compiled script, the tasks corresponding to generating the three-dimensional computer model;
identifying a first group of the tasks within the processing queue that can be executed independently of a second group of the tasks within the processing queue;
executing the first group of tasks on a first processing unit by implementing a first computer-aided design (CAD) kernel using a first bridge layer; and
executing the second group of tasks on a second processing unit that is distinct from the first processing unit by implementing a second computer-aided design (CAD) kernel using a second bridge layer.

20. The computer-implemented method of claim 19 wherein:
the three-dimensional computer model is a solid model assembly of multiple components; and
the tasks of the job set includes:
constructing a solid model for each component of a set of components of the solid model assembly via a geometry-creation command implemented with the first CAD kernel or the second CAD kernel using the first bridge layer or the second bridge layer, respectively; and
constructing the solid model assembly using the solid models.

* * * * *